United States Patent
Goto et al.

(10) Patent No.: US 12,379,658 B2
(45) Date of Patent: Aug. 5, 2025

(54) CURABLE COMPOSITION FOR IMPRINTING, METHOD FOR PRODUCING CURABLE COMPOSITION FOR IMPRINTING, CURED PRODUCT, PATTERN PRODUCING METHOD, AND METHOD FOR MANUFACTURING SEMICONDUCTOR ELEMENT

(71) Applicant: FUJIFILM Corporation, Tokyo (JP)

(72) Inventors: Yuichiro Goto, Shizuoka (JP); Naoya Shimoju, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 808 days.

(21) Appl. No.: 17/210,519

(22) Filed: Mar. 24, 2021

(65) Prior Publication Data

US 2021/0232049 A1 Jul. 29, 2021

Related U.S. Application Data

(63) Continuation of application No. PCT/JP2019/037190, filed on Sep. 24, 2019.

(30) Foreign Application Priority Data

Sep. 28, 2018 (JP) .................... 2018-185116

(51) Int. Cl.

| | |
|---|---|
| G03F 7/038 | (2006.01) |
| B29C 59/00 | (2006.01) |
| B29C 59/02 | (2006.01) |
| B82Y 20/00 | (2011.01) |
| B82Y 30/00 | (2011.01) |
| B82Y 40/00 | (2011.01) |
| C08F 2/48 | (2006.01) |
| C08F 20/10 | (2006.01) |
| H01L 21/033 | (2006.01) |

(52) U.S. Cl.
CPC ............ *G03F 7/0382* (2013.01); *B29C 59/02* (2013.01); *C08F 2/48* (2013.01); *H01L 21/0332* (2013.01); *H01L 21/0337* (2013.01); *B29C 59/005* (2013.01); *B82Y 20/00* (2013.01); *B82Y 30/00* (2013.01); *B82Y 40/00* (2013.01); *C08F 20/10* (2013.01)

(58) Field of Classification Search
None
See application file for complete search history.

(56) References Cited

U.S. PATENT DOCUMENTS

| | | |
|---|---|---|
| 9,862,847 B2 | 1/2018 | Goto et al. |
| 10,208,183 B2 | 2/2019 | Kitagawa et al. |
| 10,504,739 B2 | 12/2019 | Kitagawa et al. |
| 11,429,018 B2 | 8/2022 | Shimizu et al. |
| 2015/0037535 A1* | 2/2015 | Akimoto ............... G02B 1/005 427/508 |
| 2016/0215216 A1* | 7/2016 | Yoon ..................... C09K 19/542 |
| 2017/0158905 A1* | 6/2017 | Oomatsu .............. C09D 151/08 |
| 2019/0011827 A1 | 1/2019 | Shimizu et al. |
| 2019/0030785 A1* | 1/2019 | Kato ..................... G03F 7/0002 |
| 2019/0196073 A1* | 6/2019 | Samejima .............. G02B 5/223 |
| 2022/0317563 A1 | 10/2022 | Shimizu et al. |

FOREIGN PATENT DOCUMENTS

| | | | | |
|---|---|---|---|---|
| JP | 2010000612 | 1/2010 | | |
| JP | 2014192377 | 10/2014 | | |
| JP | 2015009171 | 1/2015 | | |
| JP | 2015012100 | 1/2015 | | |
| JP | 2015070145 | 4/2015 | | |
| JP | 2015128134 | 7/2015 | | |
| JP | 2015185798 | 10/2015 | | |
| JP | 2018097249 | 6/2018 | | |
| TW | 201807505 | 3/2018 | | |
| WO | 2005082992 | 9/2005 | | |
| WO | 2017170428 | 10/2017 | | |
| WO | 2017175668 | 10/2017 | | |
| WO | WO-2017175668 A1 * | 10/2017 | ........... | B29C 59/002 |
| WO | 2018051961 | 3/2018 | | |
| WO | WO-2018043185 A1 * | 3/2018 | ............... | G02B 1/04 |

OTHER PUBLICATIONS

"International Search Report (Form PCT/ISA/210) of PCT/JP2019/037190," mailed on Dec. 3, 2019, with English translation thereof, pp. 1-5.
"Written Opinion of the International Searching Authority (Form PCT/ISA/237) of PCT/JP2019/037190," mailed on Dec. 3, 2019, with English translation thereof, pp. 1-15.
"Office Action of Taiwan Counterpart Application", issued on Jan. 17, 2023, with English translation thereof, pp. 1-28.
"Office Action of Japan Counterpart Application", issued on Oct. 19, 2021, with English translation thereof, p. 1-p. 10.

* cited by examiner

*Primary Examiner* — Jonathan Johnson
*Assistant Examiner* — Andrew Preston Traywick
(74) *Attorney, Agent, or Firm* — JCIPRNET

(57) ABSTRACT

Provided are a curable composition for imprinting including a polymerizable compound, a photopolymerization initiator, and a particulate metal which has a particle diameter of 1 nm or larger, as measured by a single particle ICP-MASS method, and includes at least one kind of iron, copper, titanium, or lead, in which a content of the particulate metal is 100 ppt by mass to 30 ppb by mass with respect to a solid content of the composition; a method for producing the curable composition for imprinting; a cured product using the curable composition for imprinting; a pattern producing method; and a method for manufacturing a semiconductor element.

14 Claims, No Drawings

CURABLE COMPOSITION FOR IMPRINTING, METHOD FOR PRODUCING CURABLE COMPOSITION FOR IMPRINTING, CURED PRODUCT, PATTERN PRODUCING METHOD, AND METHOD FOR MANUFACTURING SEMICONDUCTOR ELEMENT

CROSS-REFERENCE TO RELATED APPLICATIONS

This application is a Continuation of PCT International Application No. PCT/JP2019/037190 filed on Sep. 24, 2019, which claims priority under 35 U.S.C § 119 (a) to Japanese Patent Application No. 2018-185116 filed on Sep. 28, 2018. Each of the above application(s) is hereby expressly incorporated by reference, in its entirety, into the present application.

BACKGROUND OF THE INVENTION

1. Field of the Invention

The present invention relates to a curable composition for imprinting, a method for producing a curable composition for imprinting, a cured product, a pattern producing method, and a method for manufacturing a semiconductor element.

2. Description of the Related Art

An imprint method is a technique in which a fine pattern is transferred to a material by pressing a metal mold (generally called a mold or a stamper) on which a pattern is formed. The imprint method enables simple and precise production of a fine pattern, and thus is expected to be applied in various fields in recent years. In particular, a nanoimprint technique for forming a fine pattern of a nano-order level is attracting attention.

As the imprint method, a method called a thermal imprint method or an optical imprint method has been proposed depending on a transfer method thereof. In the thermal imprint method, a mold is pressed against a thermoplastic resin heated to a temperature equal to or higher than a glass transition temperature (hereinafter, referred to as a "Tg" in some cases), the thermoplastic resin is cooled, and then the mold is released to form a fine pattern. In this method, various materials can be selected, but there are also problems in that a high pressure is required during pressing and a fine pattern is not easily formed due to thermal shrinkage or the like.

Meanwhile, in the optical imprint method, after photo-curing is performed in a state where a mold is pressed against a curable composition for imprinting, the mold is released. Since the imprinting is performed on an uncured product, a fine pattern can be simply formed without the need for a high pressure or heating at a high temperature.

In the optical imprint method, a curable composition for imprinting is applied onto a substrate (subjected to a close adhesion treatment, as necessary), and a mold made of a light-transmitting material such as quartz is pressed. The curable composition for imprinting is cured by light irradiation in a state where the mold is pressed, and then the mold is released to produce a cured product to which a desired pattern is transferred.

Examples of a method for applying a curable composition for imprinting onto a substrate include a spin coating method and an ink jet method. In particular, the ink jet method is an application method which has attracted attention in recent years from the viewpoint that the loss of the curable composition for imprinting is small.

In addition, a method for performing fine processing using a transferred imprint pattern as a mask is called nanoimprint lithography (NIL), and is being developed as a next-generation lithography technique which replaces the current ArF immersion process. Therefore, similar to an extreme ultraviolet (EUV) resist, a curable composition for imprinting used in NIL is capable of resolving an ultrafine pattern of 30 nm or less, and requires high etching resistance as a mask in a case of performing fine processing on an object to be processed. Specific examples of the curable composition for imprinting estimated to be used as a mask include WO2005/082992A, JP2015-009171A, JP2015-185798A, JP2015-070145A, and JP2015-128134A.

Meanwhile, JP2014-192377A discloses a method for producing a curable composition for metal reduction imprinting, wherein a mixture, which is obtained by adding an ion exchange resin in a range of 0.01 parts by mass to 5 parts by mass with respect to 1 part by mass of a curable composition for imprinting and stirring the resultant, is filtered with a filter having an adsorption action due to a zeta potential, and as a result, a content of metal impurities for each metal is reduced to 50 ppb or less.

SUMMARY OF THE INVENTION

In a case where the curable composition for imprinting is used as an etching mask, controlling an amount of impurities is important. In particular, in a case where a content of a metal component is large, processing failures are generated during etching, leading to an increase in the number of defects after processing and deterioration in a yield during device manufacturing.

However, for example, in the curable composition for imprinting described in JP2014-192377A, it was found that a metal component which is not easily removed with the ion exchange resin remains, and such a component damages a mold during imprinting. Moreover, JP2014-192377A also describes that the component is adsorbed on the ion exchange resin, and filtered with a filter (ZETA PLUS SH FILTER 40QSH), but it was found that the filtration with such a filter is also not sufficient to remove the metal component.

Furthermore, it was found that a specific particulate metal functions as an etching stopper, and thus processing failures cannot be sufficiently reduced.

The present invention aims to solve such a problem, and an object thereof is to provide a curable composition for imprinting having excellent mold durability and etching resistance, a method for producing the curable composition for imprinting, a cured product using the curable composition for imprinting, a pattern producing method, and a method for manufacturing a semiconductor element.

Under the above object, the present inventors performed an investigation, and as a result, found that mold durability and etching resistance can be improved by reducing an amount of a component, which is a particulate metal including iron, copper, titanium, or lead and has a particle diameter of 1 nm or larger. Meanwhile, it was also found that in a case where imprinting is repeated in the absence of the particulate metal, contamination of the mold is remarkable, and mold durability is degraded. Moreover, it has been found that a favorable performance could be achieved in terms of both the mold durability and the etching resistance by adopting a configuration in which the component, which is a particulate metal including iron, copper, titanium, or lead and has a particle diameter of 1 nm or larger, is contained in an amount of 100 ppt by mass to 30 ppb by mass with respect to a solid content, thereby completing the present invention.

Specifically, the above object has been achieved by the following units.

<1> A curable composition for imprinting comprising: a polymerizable compound; a photopolymerization initiator; and a particulate metal which has a particle diameter of 1 nm or larger, as measured by a single particle ICP-MASS method, and includes at least one kind of iron, copper, titanium, or lead, in which a content of the particulate metal is 100 ppt by mass to 30 ppb by mass with respect to a solid content of the composition.

<2> The curable composition for imprinting as described in <1>, further comprising a particulate metal which is other than the aforementioned particulate metal, has a particle diameter of 1 nm or larger, as measured by the single particle ICP-MASS method, and contains at least one kind of sodium, potassium, calcium, magnesium, manganese, aluminum, lithium, chromium, nickel, tin, zinc, arsenic, silver, gold, cadmium, cobalt, vanadium, or tungsten, in which a total amount of the particulate metal which has a particle diameter of 1 nm or larger, as measured by the single particle ICP-MASS method, and contains at least one kind of iron, copper, titanium, or lead and the particulate metal which is other than the aforementioned particulate metal, has a particle diameter of 1 nm or larger, as measured by the single particle ICP-MASS method, and contains at least one kind of sodium, potassium, calcium, magnesium, manganese, aluminum, lithium, chromium, nickel, tin, zinc, arsenic, silver, gold, cadmium, cobalt, vanadium, or tungsten is 250 ppt by mass to 40 ppb by mass with respect to the solid content of the composition.

<3> The curable composition for imprinting as described in <1> or <2>, in which an amine value is 1 mmol/g or less.

<4> The curable composition for imprinting as described in any one of <1> to <3>, in which an acid value is 1 mmol/g or less.

<5> The curable composition for imprinting as described in any one of <1> to <4>, in which a solvent is not substantially contained.

<6> The curable composition for imprinting as described in any one of <1> to <5>, in which a polymer having a weight-average molecular weight of 2,000 or greater is not substantially contained.

<7> The curable composition for imprinting as described in any one of <1> to <6>, in which a silicon atom is not substantially contained.

<8> The curable composition for imprinting as described in <7>, further comprising a release agent.

<9> The curable composition for imprinting as described in any one of <1> to <8>, in which a content of the polymerizable compound in the composition is 80% by mass or greater.

<10> A method for producing the curable composition for imprinting as described in any one of <1> to <9>, comprising using raw materials subjected to at least one of a distillation treatment or an acid cleaning treatment.

<11> The method for producing the curable composition for imprinting as described in <10>, further comprising mixing the raw materials of the composition and then subjecting the mixture to a filtration treatment with a filter containing polyamide.

<12> A cured product formed of the curable composition for imprinting as described in any one of <1> to <9>.

<13> A pattern producing method comprising applying the curable composition for imprinting as described in any one of <1> to <9> onto a substrate or a mold and irradiating the curable composition for imprinting with light in a state of being sandwiched between the mold and the substrate.

<14> The pattern producing method as described in <13>, in which a pattern has at least one shape of a line, a hole, or a pillar, which has a size of 100 nm or less.

<15> A method for manufacturing a semiconductor element, comprising the pattern producing method as described in <13> or <14>.

<16> The method for manufacturing a semiconductor element as described in <15>, further comprising performing etching using a pattern obtained by the pattern producing method as described in <13> or <14> as a mask.

According to the present invention, it is possible to provide a curable composition for imprinting having excellent mold durability and etching resistance, a method for producing the curable composition for imprinting, a cured product using the curable composition for imprinting, a pattern producing method, and a method for manufacturing a semiconductor element.

DESCRIPTION OF THE PREFERRED EMBODIMENTS

Hereinafter, contents of the present invention will be described in detail. Moreover, in the present specification, "to" is used to mean that the preceding and succeeding numerical values of "to" are included as a lower limit value and an upper limit value, respectively.

In the present specification, "(meth)acrylate" represents acrylate and methacrylate, "(meth)acryl" represents acryl and methacryl, and "(meth)acryloyl" represents acryloyl and methacryloyl. "(Meth)acryloyloxy" represents acryloyloxy and methacryloyloxy.

In the present specification, "imprint" preferably refers to transfer of a pattern with a size of 1 nm to 10 mm, and more preferably refers to transfer of a pattern with a size of about 10 nm to 100 μm (nanoimprint).

In descriptions of a group (atomic group) in the present specification, in a case where the group is described without specifying whether the group is substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

In the present specification, "light" includes not only light having a wavelength in an ultraviolet, near-ultraviolet, far-ultraviolet, visible, or infrared range, or an electromagnetic wave but also radiation. Examples of the radiation include a microwave, an electron beam, an extreme ultraviolet ray (EUV), and an X-ray. Moreover, laser light such as a 248-nm excimer laser, a 193-nm excimer laser, and a 172-nm excimer laser can also be used. The light may be monochromatic light (single-wavelength light) passing through an optical filter, or may be light (composite light) having a plurality of different wavelengths.

In the present specification, a solid content refers to a total mass of all components of the composition, excluding a solvent.

In the present invention, an atmospheric pressure in a case of measuring a boiling point is 101,325 Pa (1 atm), unless otherwise specified. In the present invention, a temperature is 23° C., unless otherwise specified.

In the present specification, a term "step" includes not only an independent step, but also a step which is not clearly distinguished from other steps in a case where an intended action of the step is obtained.

In the present specification, a weight-average molecular weight (Mw) and a number-average molecular weight (Mn) are each defined as a value in terms of polystyrene according to gel permeation chromatography (GPC measurement), unless otherwise specified. In the present specification, the weight-average molecular weight (Mw) and the number-average molecular weight (Mn) can be determined, for example, by using HLC-8220 (manufactured by TOSOH CORPORATION), and, as a column, GUARD COLUMN HZ-L, TSKgel Super HZM-M, TSKgel Super HZ4000, TSKgel Super HZ3000, or TSKgel Super HZ2000 (manufactured by TOSOH CORPORATION). An eluent is measured using tetrahydrofuran (THF), unless otherwise specified. Moreover, for detection, a detector of ultraviolet rays (UV rays) having a wavelength of 254 nm is used, unless otherwise specified.

A curable composition for imprinting according to an embodiment of the present invention (hereinafter, simply referred to as a "composition according to the embodiment of the present invention" in some cases) is a curable composition for imprinting including: a polymerizable compound; a photopolymerization initiator; and a particulate metal (hereinafter, referred to as a "specific particulate metal" in some cases) which has a particle diameter of 1 nm or larger, as measured by a single particle inductively coupled plasma (ICP)-mass spectrometry (MASS) method, and includes at least one kind of iron, copper, titanium, or lead, in which a content of the particulate metal is 100 ppt by mass to 30 ppb by mass with respect to a solid content of the composition.

It is presumed that by setting a content of a specific particulate metal, which is not easily removed with an ion exchange resin or the like, to 30 ppb by mass or less as described above, damage to a mold can be effectively suppressed, and thus mold durability can be improved. This mechanism is presumed to be possible because in a case where the amount of the specific particulate metal contained in the composition is greater than the above range, the mold is brought into physical contact with the specific particulate metal during imprinting, and damage to the mold is caused. Moreover, by setting amount of the specific particulate metal to 30 ppb by mass or less, etching resistance (decrease in a yield of the device due to etching defects during dry etching) can also be remarkably improved. In particular, a particulate metal including at least one kind of iron, copper, titanium, or lead easily acts as an etching stopper during etching, and affects an increase in defects during etching processing.

Furthermore, it is presumed that by setting the amount of the specific particulate metal to 100 ppt by mass or greater, contamination of a mold can be effectively suppressed, and thus mold durability can be improved. This mechanism is presumed to be possible because in a case where a small amount of the specific particulate metal is contained in the composition, mold contamination impurities in the curable composition for imprinting are effectively trapped. Moreover, a particulate metal having a particle diameter of 1 nm or larger affects mold durability.

In addition, by setting the specific particulate metal to 30 ppb by mass or less, temporal stability of the curable composition for imprinting can be improved.

Hereinafter, the present invention will be described in detail.

<Specific Particulate Metal>

The composition according to the embodiment of the present invention contains, in a proportion of 100 ppt by mass to 30 ppb by mass in total with respect to the solid content, a particulate metal which has a particle diameter of 1 nm or larger, as measured by the single particle ICP-MASS method, and includes at least one kind of iron, copper, titanium, or lead.

The specific particulate metal is not particularly specified as long as the specific particulate metal is a particle including at least one kind of iron, copper, titanium, or lead, and is intended to also include a particle consisting of two or more kinds of iron, copper, titanium, and lead, a particle consisting of at least one kind of iron, copper, titanium, or lead and another metal, and a particle consisting of at least one kind of iron, copper, titanium, or lead and a nonmetal.

A particle diameter of the specific particulate metal is 1 nm or larger. A particulate metal of 1 nm or larger affects mold durability. The upper limit thereof is not particularly specified as long as the amount of the specific particulate metal is 30 ppb by mass or less with respect to the solid content, but is practically 999 nm or smaller.

By containing a particulate metal including a metal having a large particle diameter, in a case where the mold is brought into contact with the curable composition for imprinting, damage to the mold (in particular, damage to the mold pattern) tends to be caused. Moreover, in a case where the specific particulate metal is present in the curable composition for imprinting, the specific particulate metal functions as an etching stopper, and thus etching defects are generated. In particular, the specific particulate metal has higher localization of metal components compared to a metal ion, and thus fatal etching defects are generated, causing a decrease in a yield of the device in some cases. In the present invention, such a problem is solved by limiting the content of the specific particulate metal as described above.

Furthermore, the etching defects tend to be remarkably generated, in particular, in the curable composition for imprinting which does not contain an inorganic substance (for example, Si) having low resistance to etching processing, but such a problem can also be effectively suppressed.

The composition according to the embodiment of the present invention contains the specific particulate metal in a proportion of 100 ppt by mass to 30 ppb by mass with respect to the solid content. By setting the content to be equal to or less than the upper limit value, mold durability is improved, generation of etching defects is remarkably suppressed, and a yield of a semiconductor element is improved. Moreover, temporal stability of the curable composition for imprinting can also be improved.

The lower limit value of the content of the specific particulate metal is preferably 150 ppt by mass or greater and more preferably 200 ppt by mass or greater. Moreover, the upper limit value of the content of the specific particulate metal is preferably 25 ppb by mass or less, more preferably 19 ppb by mass or less, still more preferably 15 ppb by mass or less, even more preferably 10 ppb by mass or less, further still more preferably 8 ppb by mass or less, further still more preferably 5 ppb by mass or less, and further still more preferably 3 ppb by mass or less, and may be 1.5 ppb by mass or less or 1 ppb by mass or less. As described above, by setting the amount of the specific particulate metal to 30 ppb by mass or less, an etching system tends to be improved. Meanwhile, by setting the amount to 100 ppt by mass or greater, contamination of the mold in a case where imprinting is repeatedly performed can be effectively suppressed.

The reason for this is not clear, but it is considered that the specific particulate metal traps a trace amount of polar organic impurities contained in the curable composition for imprinting. Furthermore, in a case where the specific particulate metal is contained, an etching stopper (portion which cannot be etched) is generated, and thus processing failures are likely to be generated. In the present invention, such a problem is avoided by setting the amount of the specific particulate metal to 30 ppb by mass or less.

The lower limit value of a content of a particulate metal which has a particle diameter of 1 nm or larger, as measured by the single particle ICP-MASS method, and includes iron is preferably 0.01 ppb by mass or greater and more preferably 0.07 ppb by mass or greater. Moreover, the upper limit value thereof is preferably 20 ppb by mass or less, more preferably 8 ppb by mass or less, still more preferably 2 ppb by mass or less, and even more preferably 1 ppb by mass or less.

The lower limit value of a content of a particulate metal which has a particle diameter of 1 nm or larger, as measured by the single particle ICP-MASS method, and includes copper is preferably 0.01 ppb by mass or greater and more preferably 0.05 ppb by mass or greater. Moreover, the upper limit value thereof is preferably 10 ppb by mass or less, more preferably 5 ppb by mass or less, still more preferably 1 ppb by mass or less, and even more preferably 0.8 ppb by mass or less.

The lower limit value of a content of a particulate metal which has a particle diameter of 1 nm or larger, as measured by the single particle ICP-MASS method, and includes titanium is preferably 0.005 ppb by mass or greater and more preferably 0.02 ppb by mass or greater. Moreover, the upper limit value thereof is preferably 7 ppb by mass or less, more preferably 3 ppb by mass or less, still more preferably 1 ppb by mass or less, and even more preferably 0.2 ppb by mass or less.

The lower limit value of a content of a particulate metal which has a particle diameter of 1 nm or larger, as measured by the single particle ICP-MASS method, and includes lead is preferably 0.001 ppb by mass or greater. Moreover, the upper limit value thereof is preferably 5 ppb by mass or less and more preferably 1 ppb by mass or less.

The particle diameter (particle diameter measured by the single particle ICP-MASS method) and the content of the specific particulate metal are measured by methods described in Examples described later. In a case where the measurement is not possible with equipment used in Examples, or in a case where the equipment is difficult to obtain due to discontinuance or the like, Agilent 8900 can be used, and in a case where the measurement is not possible with Agilent 8900, or in a case where the equipment is difficult to obtain due to discontinuance or the like, NexION350S manufactured by PerkinElmer Co., Ltd. can be used.

<Particulate Metal Including Metal Other than Specific Particulate Metal>

The composition according to the embodiment of the present invention contains a particulate metal (hereinafter, referred to as a "particulate metal including other metals" in some cases) which is a particle other than the aforementioned specific particulate metal, has a particle diameter of 1 nm or larger, as measured by the single particle ICP-MASS method, and includes at least one kind of sodium, potassium, calcium, magnesium, manganese, aluminum, lithium, chromium, nickel, tin, zinc, arsenic, silver, gold, cadmium, cobalt, vanadium, or tungsten, and a total amount thereof is preferably 150 ppt by mass to 60 ppb by mass and more preferably 250 ppt by mass to 40 ppb by mass with respect to the solid content. With such a configuration, the effects of the present invention are more effectively exhibited. Moreover, releasability can also be improved.

The lower limit value of a total content of the specific particulate metal and the particulate metal including other metals is preferably 0.3 ppb by mass or greater with respect to the solid content of the composition. Moreover, the upper limit value thereof is preferably 100 ppb by mass or less, more preferably 50 ppb by mass or less, still more preferably 10 ppb by mass or less, and even more preferably 5 ppb by mass or less.

The amount of the particulate metal including a metal other than the specific particulate metal is measured by the methods described in Examples described later.

The composition according to the embodiment of the present invention preferably contains at least two kinds of sodium, potassium, calcium, magnesium, manganese, aluminum, lithium, chromium, nickel, tin, zinc, arsenic, silver, gold, cadmium, cobalt, vanadium, or tungsten, more preferably contains at least three kinds among them, and still more preferably contains at least four kinds among them, as the particulate metal including a metal other than the specific particulate metal. With such a configuration, the mold durability tends to be further improved.

<Polymerizable Compound>

The composition according to the embodiment of the present invention further contains a polymerizable compound. The polymerizable compound is preferably a radically polymerizable compound.

The polymerizable compound may be a monofunctional polymerizable compound having one polymerizable group, or a polyfunctional polymerizable compound having two or more polymerizable groups. The curable composition for imprinting according to the embodiment of the present invention preferably contains a polyfunctional polymerizable compound, and more preferably contains both a polyfunctional polymerizable compound and a monofunctional polymerizable compound.

The polyfunctional polymerizable compound preferably includes at least one kind of a bifunctional polymerizable compound or a trifunctional polymerizable compound, and more preferably at least one kind of bifunctional polymerizable compounds.

Examples of the polymerizable group of the polymerizable compound include groups having an ethylenically unsaturated bond, such as a vinyl group, an allyl group, a vinylphenyl group, a (meth)acryloyl group, a (meth)acryloyloxy group, and a (meth)acryloylamino group. The polymerizable group is preferably a (meth)acryloyl group, a (meth)acryloyloxy group, and a (meth)acryloylamino group, and more preferably an acryloyl group, an acryloyloxy group, and an acryloylamino group.

A molecular weight of the polymerizable compound in the present invention is preferably less than 2,000, more preferably 1,500 or less, and still more preferably 1,000 or less, and may be 800 or less. The lower limit value thereof is preferably 100 or greater.

The polymerizable compound in the present invention may or may not contain a silicon atom. As one embodiment of the present invention, an embodiment in which the polymerizable compound is a polymerizable compound having a silicone skeleton is exemplified. As another embodiment of the present invention, an embodiment in which the polymerizable compound is a polymerizable compound containing no silicon atom is exemplified. Examples of the polymerizable compound having a silicone skeleton include SILICONE ACRYLATE X-22-1602 produced by Shin-Etsu Chemical Co., Ltd.

A content of the polymerizable compound in the curable composition for imprinting according to the embodiment of the present invention is preferably 40% by mass or greater, more preferably 60% by mass or greater, still more preferably 75% by mass or greater, and even more preferably 80% by mass or greater. Moreover, the content of the polymerizable compound in the curable composition for imprinting according to the embodiment of the present invention is preferably 99.9% by mass or less, more preferably 99% by mass or less, and still more preferably 98% by mass or less.

Only one kind or two or more kinds of other radically polymerizable compounds may be contained. In a case where two or more kinds thereof are contained, the total amount thereof is preferably within the above range.

<<Polyfunctional Polymerizable Compound>>

The number of polymerizable groups of the polyfunctional polymerizable compound used in the present invention is 2 or more, preferably 2 to 7, more preferably 2 to 4, still more preferably 2 or 3, and even more preferably 2.

In the present invention, it is preferable to include a compound represented by Formula (2). By using such a compound, adhesiveness, a releasing force, and temporal stability tend to be well-balanced and superior.

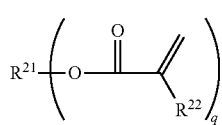

(2)

In the formula, $R^{21}$ is a q-valent organic group, $R^{22}$ is a hydrogen atom or a methyl group, and q is an integer of 2 or more. q is preferably an integer of 2 to 7, more preferably an integer of 2 to 4, still more preferably 2 or 3, and even more preferably 2.

$R^{21}$ is preferably a divalent to heptavalent organic group, more preferably a divalent to tetravalent organic group, still more preferably a divalent or trivalent organic group, and even more preferably a divalent organic group. $R^{21}$ is preferably a hydrocarbon group having at least one of a linear structure, a branched structure, or a cyclic structure. The number of carbon atoms in the hydrocarbon group is preferably 2 to 20 and more preferably 2 to 10.

In a case where $R^{21}$ is a divalent organic group, $R^{21}$ is preferably an organic group represented by Formula (1-2).

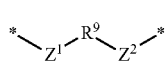

(1-2)

In the formula, it is preferable that $Z^1$ and $Z^2$ are each independently a single bond, —O—, -Alk-, or -Alk-O—. Alk represents an alkylene group (the number of the carbon atoms is preferably 1 to 12, more preferably 1 to 6, and still more preferably 1 to 3), and may have a substituent as long as the effects of the present invention are not impaired.

$R^9$ is preferably a single bond, a linking group selected from Formulae (9-1) to (9-10), or a combination thereof. Among them, a linking group selected from Formulae (9-1) to (9-3), (9-7), and (9-8) is preferable.

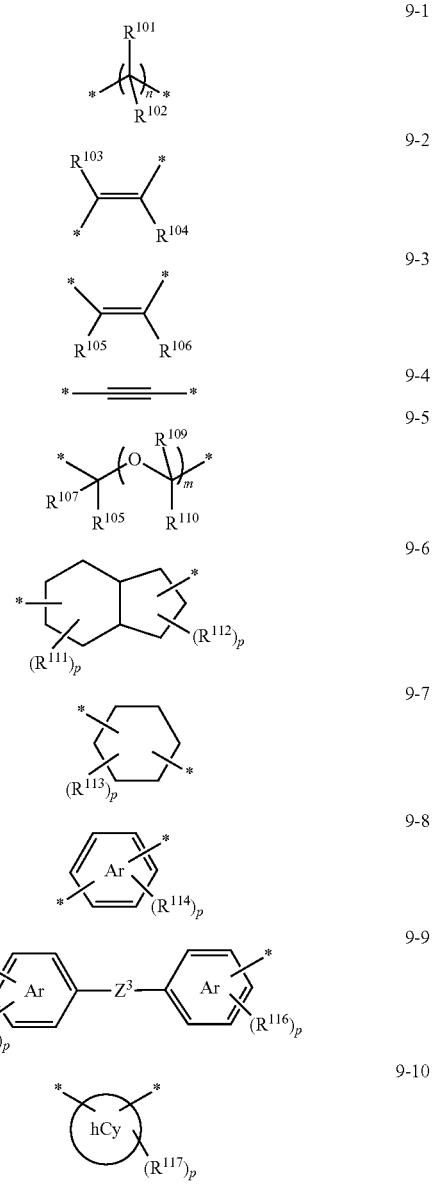

$R^{101}$ to $R^{117}$ are optional substituents. Among them, an alkyl group (the number of the carbon atoms is preferably 1 to 12, more preferably 1 to 6, and still more preferably 1 to 3), an aralkyl group (the number of the carbon atoms is preferably 7 to 21, more preferably 7 to 15, and still more preferably 7 to 11), an aryl group (the number of the carbon atoms is preferably 6 to 22, more preferably 6 to 18, and still more preferably 6 to 10), a thienyl group, a furyl group, a (meth)acryloyl group, a (meth)acryloyloxy group, and a (meth)acryloyloxyalkyl group (the number of the carbon atoms in the alkyl group is preferably 1 to 24, more preferably 1 to 12, and still more preferably 1 to 6) are preferable. $R^{101}$ and $R^{102}$, $R^{103}$ and $R^{104}$, $R^{105}$ and $R^{106}$, $R^{107}$ and $R^{108}$, $R^{109}$ and $R^{110}$, a plurality of $R^{111}$'s, a plurality of $R^{112}$'s, a plurality of $R^{113}$'s, a plurality of $R^{114}$'s, a plurality of $R^{115}$'s, a plurality of $R^{116}$'s, and a plurality of $R^{117}$'s may be respectively bonded to each other to form a ring.

Ar is an arylene group (the number of the carbon atoms is preferably 6 to 22, more preferably 6 to 18, and still more preferably 6 to 10), and specific examples thereof include a phenylene group, a naphthalenediyl group, an anthracenediyl group, a phenanthrenediyl group, and a fluorenediyl group.

hCy is a heterocyclic group (the number of the carbon atoms is preferably 1 to 12, more preferably 1 to 6, and still more preferably 2 to 5), and is more preferably a 5-membered ring or a 6-membered ring. Specific examples of a heterocyclic ring constituting hCy include a thiophene ring, a furan ring, a dibenzofuran ring, a carbazole ring, an indole ring, a tetrahydropyran ring, a tetrahydrofuran ring, a pyrrole ring, a pyridine ring, a pyrazole ring, an imidazole ring, a benzimidazole ring, a triazole ring, a thiazole ring, an oxazole ring, a pyrrolidone ring, and a morpholine ring, and among them, a thiophene ring, a furan ring, and a dibenzofuran ring are preferable.

$Z^3$ is a single bond or a linking group. Examples of the linking group include alkylene groups (the number of the carbon atoms is preferably 1 to 12, more preferably 1 to 6, and still more preferably 1 to 3) in which an oxygen atom, a sulfur atom, and a fluorine atom may be substituted.

n and m are each a natural number of 100 or less, preferably 1 to 12, more preferably 1 to 6, and still more preferably 1 to 3.

p is 0 or more and is an integer equal to or less than the maximum number of groups which can be substituted for each ring. In the respective cases, the upper limit values are independently preferably equal to or less than half of the maximum number of the substitutable group, more preferably 4 or less, and still more preferably 2 or less.

The polyfunctional polymerizable compound is preferably represented by Formula (2-1).

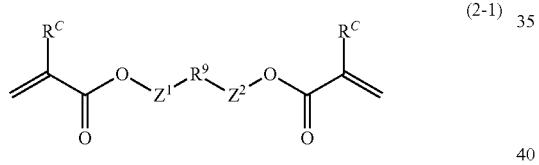

(2-1)

$R^9$, $Z^1$, and $Z^2$ in Formula (2-1) have the same definitions as $R^9$, $Z^1$, and $Z^2$ in Formula (1-2), respectively, and preferred ranges thereof are also the same.

Only one kind or two or more kinds of these polyfunctional polymerizable compounds may be contained.

A type of an atom constituting the polyfunctional polymerizable compound used in the present invention is not particularly specified, but the polyfunctional polymerizable compound is preferably constituted of only atoms selected from a carbon atom, an oxygen atom, a hydrogen atom, and a halogen atom, and more preferably constituted of only atoms selected from a carbon atom, an oxygen atom, and a hydrogen atom.

Examples of the polyfunctional polymerizable compound preferably used in the present invention include the following compounds. Moreover, the examples include the polymerizable compound described in JP2014-170949A, the contents of which are incorporated in the present specification.

Compound B-1

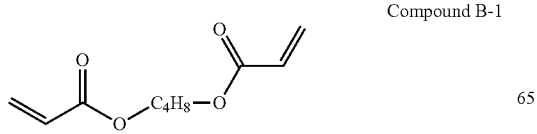

Compound B-2

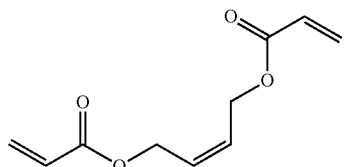

Compound B-3

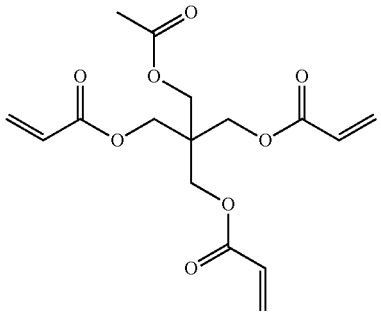

Compound B-4

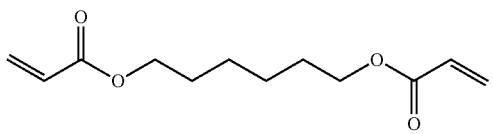

Compound B-5

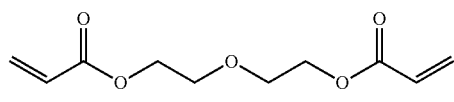

Compound B-6

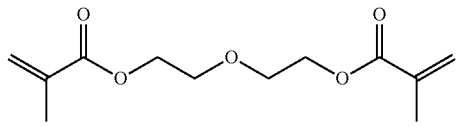

Compound B-7

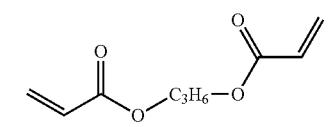

Compound B-8

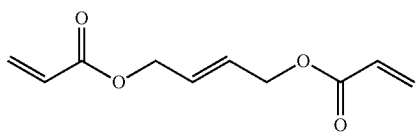

Compound B-9

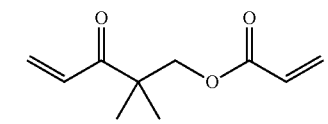

Compound B-10

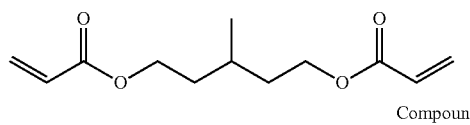

Compound B-11

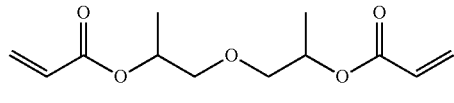

Compound B-12
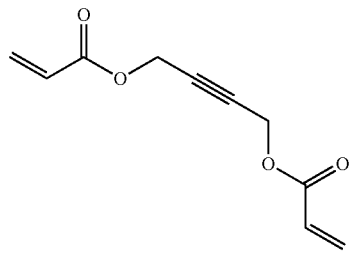
Compound B-13
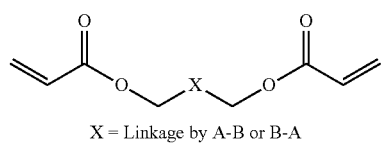
X = Linkage by A-B or B-A
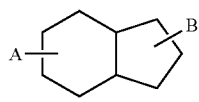
Compound B-14
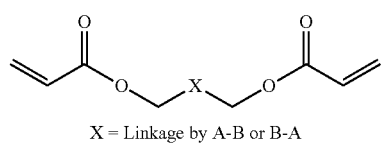
X = Linkage by A-B or B-A
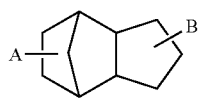
Compound B-15
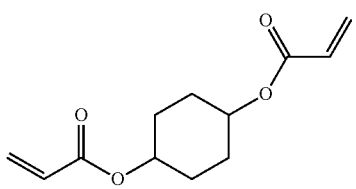
Compound B-16
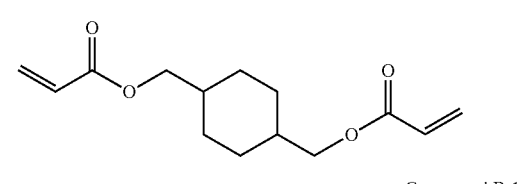
Compound B-17
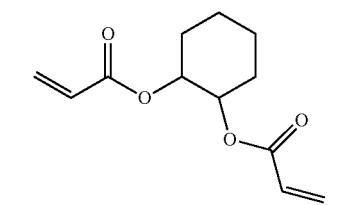
Compound B-18
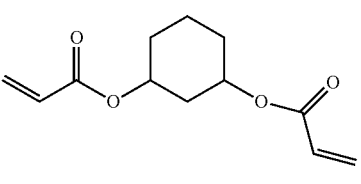
Compound B-19
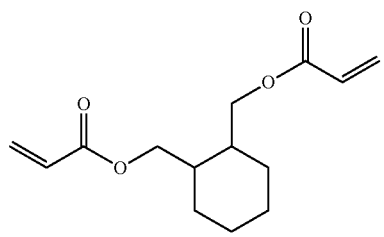
Compound B-20
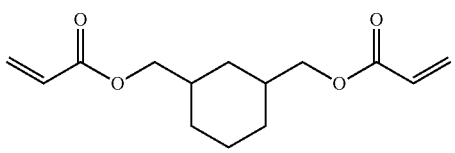
Compound B-21
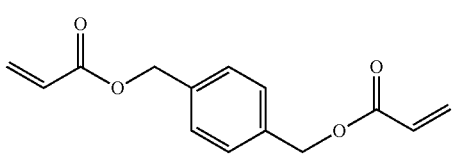
Compound B-22
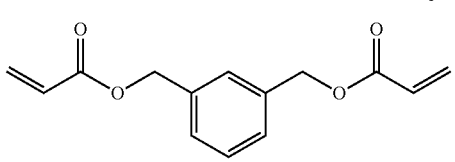
Compound B-23
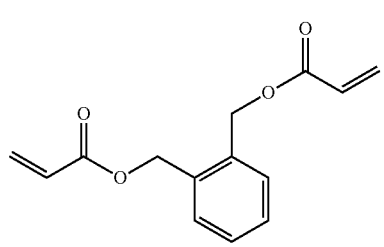
Compound B-24
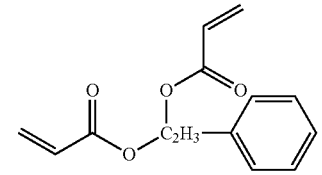
Compound B-25
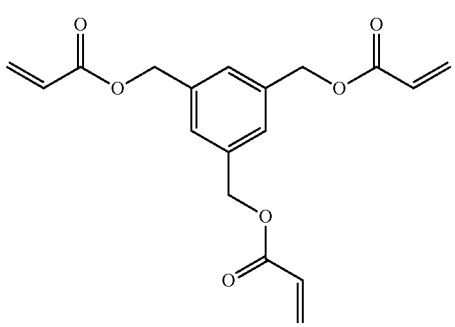

-continued

Compound B-26
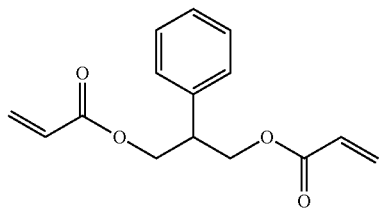

Compound B-27
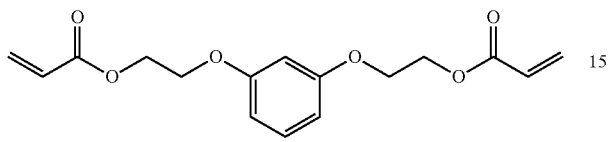

Compound B-28
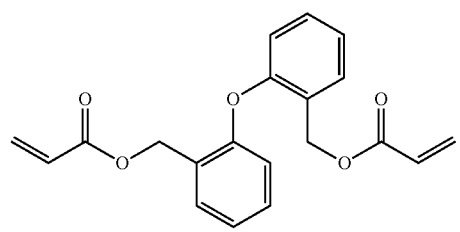

Compound B-29
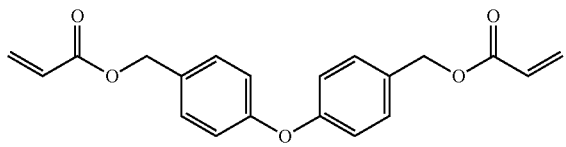

Compound B-30
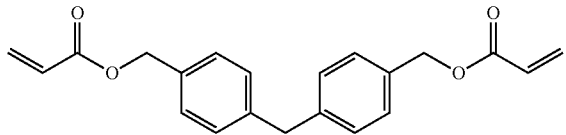

Compound B-31
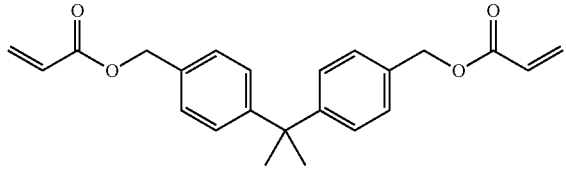

Compound B-32
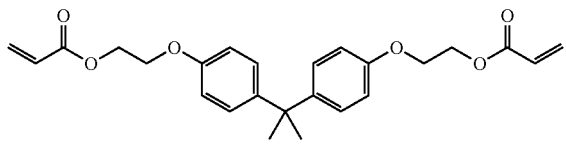

Compound B-33
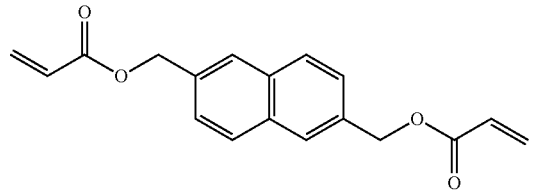

-continued

Compound B-34
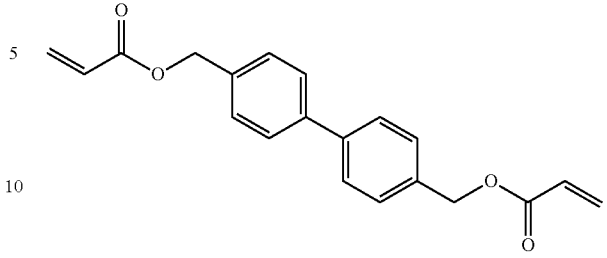

Compound B-35
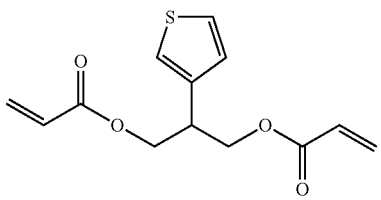

Compound B-36
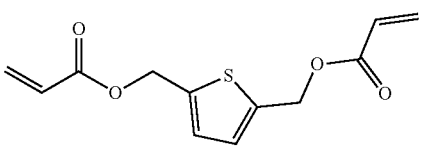

Compound B-37
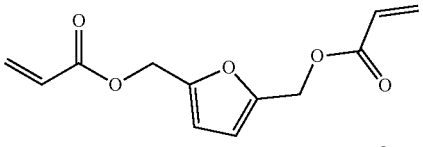

Compound B-38
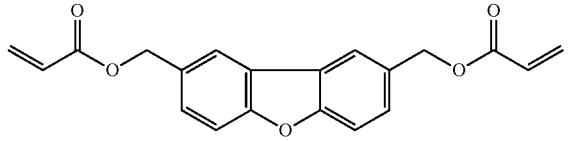

An amount of the polyfunctional polymerizable compound used in the present invention is preferably 30% to 99% by mass, more preferably 50% to 95% by mass, and still more preferably 75% to 90% by mass, and may be 80% to 90% by mass with respect to the total polymerizable compounds in the curable composition for imprinting.

Only one kind or two or more kinds of the polyfunctional polymerizable compounds may be contained. In a case where two or more kinds thereof are contained, the total amount thereof is preferably within the above range.

<<Monofunctional Polymerizable Compound>>

The monofunctional polymerizable compound used in the present invention is not particularly specified as long as a type thereof does not depart from the spirit of the present invention. It is preferable that the monofunctional polymerizable compound used in the present invention has a cyclic structure, or a linear or branched hydrocarbon chain having 4 or more carbon atoms. In the present invention, only one kind or two or more kinds of the monofunctional polymerizable compounds may be contained.

The monofunctional polymerizable compound used in the present invention is preferably a liquid at 25° C.

In the present invention, the liquid at 25° C. means a compound having fluidity at 25° C., for example, a compound having a viscosity at 25° C. of 1 to 100,000 mPa·s. For example, the viscosity of the monofunctional polymerizable compound at 25° C. is more preferably 10 to 20,000 mPa's and still more preferably 100 to 15,000 mPa·s.

By using a compound which is a liquid at 25° C., a configuration in which a solvent is not substantially contained can be adopted. Moreover, distillation described later is also easily performed. Here, the expression "solvent is not substantially contained" means, for example, that a content of the solvent is 5% by mass or less, further 3% by mass or less, and particularly 1% by mass or less with respect to the curable composition for imprinting according to the embodiment of the present invention.

The viscosity of the monofunctional polymerizable compound used in the present invention at 25° C. is preferably 100 mPa·s or lower, more preferably 10 mPa·s or lower, still more preferably 8 mPa's or lower, and even more preferably 6 mPa's or lower. By setting the viscosity of the monofunctional polymerizable compound at 25° C. to be equal to or lower than the upper limit value, the viscosity of the curable composition for imprinting can be reduced, and thus filling properties tend to be improved. The lower limit value thereof is not particularly specified, but can be, for example, 1 mPa's or higher.

The monofunctional polymerizable compound used in the present invention is preferably a monofunctional (meth) acrylic monomer and more preferably monofunctional acrylate.

A type of an atom constituting the monofunctional polymerizable compound used in the present invention is not particularly specified, but the monofunctional polymerizable compound is preferably constituted of only atoms selected from a carbon atom, an oxygen atom, a hydrogen atom, and a halogen atom, and more preferably constituted of only atoms selected from a carbon atom, an oxygen atom, and a hydrogen atom.

The monofunctional polymerizable compound used in the present invention preferably has a plastic structure. For example, it is preferable that at least one kind of the monofunctional polymerizable compounds used in the present invention contains one group selected from the group consisting of the following (1) to (3).

(1) A group (hereinafter, referred to as a "group (1)" in some cases) which has at least one of an alkyl chain or an alkenyl chain and at least one of an alicyclic structure or an aromatic ring structure, and has the total number of carbon atoms of 7 or more
(2) A group (hereinafter, referred to as a "group (2)" in some cases) having an alkyl chain having 4 or more carbon atoms
(3) A group (hereinafter, referred to as a "group (3)" in some cases) having an alkenyl chain having 4 or more carbon atoms With such a configuration, a modulus of elasticity of a cured film can be efficiently reduced while reducing the addition amount of the monofunctional polymerizable compound contained in the curable composition for imprinting. Moreover, interfacial energy with the mold is reduced, and thus an effect of reducing a releasing force (effect of improving releasability) can be enhanced.

In the groups (1) to (3), the alkyl chain and the alkenyl chain may be any one of linear, branched, or cyclic, and are each independently preferably linear or branched. Moreover, it is preferable that the groups (1) to (3) have at least one of the alkyl chain or an alkenyl chain at a terminal of the monofunctional polymerizable compound, that is, at least one of an alkyl group or an alkenyl group. With such a structure, releasability can be further improved.

The alkyl chain and the alkenyl chain may each independently contain an ether group (—O—), but it is preferable that an ether group is not contained from the viewpoint of improvement in releasability.

<<Group (1)>>

The total number of carbon atoms in the group (1) is preferably 35 or less and more preferably 10 or less.

As the cyclic structure, a single ring or a fused ring of 3- to 8-membered rings is preferable. The number of rings constituting the fused ring is preferably 2 or 3. The cyclic structure is more preferably a 5-membered ring or a 6-membered ring and still more preferably a 6-membered ring. Moreover, a single ring is more preferable. As the cyclic structure in the group (1), a cyclohexane ring, a benzene ring, and a naphthalene ring are more preferable, and a benzene ring is particularly preferable. Moreover, the cyclic structure is preferably an aromatic ring structure.

The number of cyclic structures in the group (1) may be 1 or may be 2 or more, but is preferably 1 or 2 and more preferably 1. Furthermore, in a case of the fused ring, the fused ring is considered as one cyclic structure.

<<Group (2)>>

The group (2) is a group having an alkyl chain having 4 or more carbon atoms, and preferably a group (that is, an alkyl group) consisting of an alkyl chain having 4 or more carbon atoms. The number of carbon atoms in the alkyl chain is preferably 7 or more and more preferably 9 or more. The upper limit value of the number of carbon atoms in the alkyl chain is not particularly limited, but can be, for example, 25 or less. Moreover, a compound in which some carbon atoms of the alkyl chain are substituted with silicon atoms can also be exemplified as the monofunctional polymerizable compound.

<<Group (3)>>

The group (3) is a group having an alkenyl chain having 4 or more carbon atoms, and preferably a group (that is, an alkylene group) consisting of an alkenyl chain having 4 or more carbon atoms. The number of carbon atoms in the alkenyl chain is preferably 7 or more and more preferably 9 or more. The upper limit value of the number of carbon atoms in the alkenyl chain is not particularly limited, but can be, for example, 25 or less.

The monofunctional polymerizable compound used in the present invention is preferably a compound in which any one or more of the groups (1), (2), or (3) are bonded to a polymerizable group directly or via a linking group, and more preferably a compound in which any one of the groups (1), (2), or (3) is directly bonded to a polymerizable group. Examples of the linking group include -O—, —C(=O)—, —CH$_2$—, —NH—, or a combination thereof.

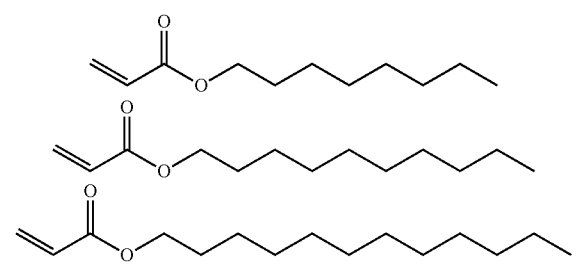

-continued

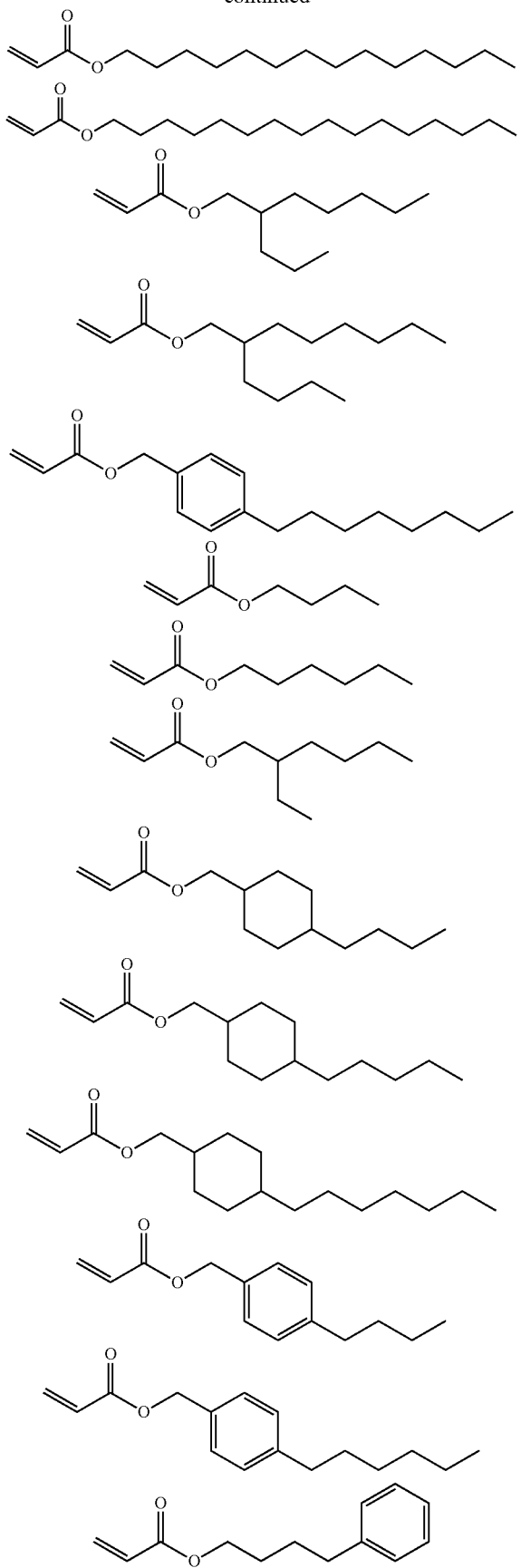

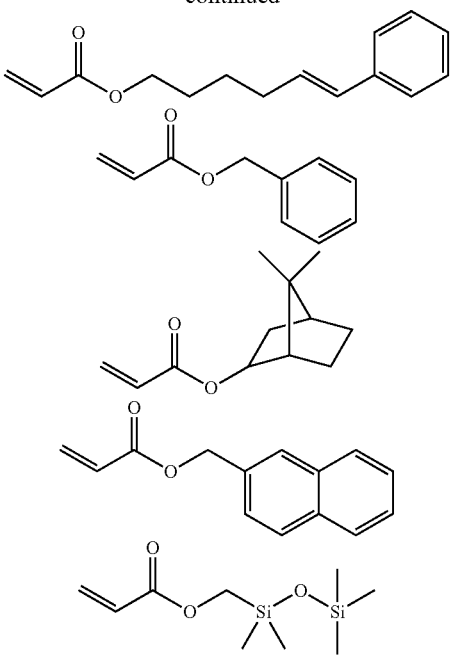

The lower limit value of an amount of the monofunctional polymerizable compound used in the present invention is preferably 1% by mass or greater, more preferably 3% by mass or greater, still more preferably 5% by mass or greater, and even more preferably 7% by mass or greater with respect to the total polymerizable compounds in the curable composition for imprinting. Moreover, the upper limit value thereof is more preferably 29% by mass or less, still more preferably 27% by mass or less, even more preferably 25% by mass or less, further still more preferably 20% by mass or less, and further still more preferably 15% by mass or less. By setting the amount of the monofunctional polymerizable compound with respect to the total polymerizable compounds to be equal to or greater than the lower limit value, releasability can be improved, and thus defects or damage to the mold can be suppressed in a case of releasing the mold. Furthermore, by setting the amount to be equal to or less than the upper limit value, a Tg of a cured film of the curable composition for imprinting can be increased, and thus resistance to etching processing, in particular, waviness of a pattern during etching can be suppressed.

In the present invention, monofunctional polymerizable compounds other than the aforementioned monofunctional polymerizable compound may be used as long as the compounds do not depart from the spirit of the present invention, and examples thereof include the monofunctional polymerizable compounds among the polymerizable compounds described in JP2014-170949A, the contents of which are incorporated in the present specification.

<Photopolymerization Initiator>

The curable composition for imprinting according to the embodiment of the present invention contains a photopolymerization initiator.

The photopolymerization initiator is preferably a photoradical polymerization initiator. As the photoradical polymerization initiator used in the present invention, any compound can be used as long as the compound generates an active species which polymerizes the aforementioned polymerizable compounds by light irradiation.

As the photoradical polymerization initiator, for example, commercially available initiators can be used. As examples thereof, the initiators described in, for example, paragraph 0091 of JP2008-105414A can be preferably adopted. Among them, an acetophenone-based compound, an acylphosphine oxide-based compound, and an oxime ester-based compound are preferable from the viewpoints of curing sensitivity and absorption characteristics. Examples of a commercially available product thereof include IRGACURE (registered trademark) 1173, IRGACURE 184, IRGACURE 2959, IRGACURE 127, IRGACURE 907, IRGACURE 369, IRGACURE 379, LUCIRIN (registered trademark) TPO, IRGACURE 819, IRGACURE OXE-01, IRGACURE OXE-02, IRGACURE 651, and IRGACURE 754 (all produced by BASF SE).

In the present invention, an oxime compound having a fluorine atom can also be used as the photoradical polymerization initiator. Specific examples of the oxime compound having a fluorine atom include the compound described in JP2010-262028A, the compounds 24 and 36 to 40 described in JP2014-500852A, and the compound (C-3) described in JP2013-164471A. The contents thereof are incorporated in the present specification.

One kind of the photoradical polymerization initiator may be used singly, but it is also preferable to use two or more kinds thereof in combination. Specific examples thereof include combinations of DAROCUR 1173 and IRGACURE 907, DAROCUR 1173 and LUCIRIN TPO, DAROCUR 1173 and IRGACURE 819, DAROCUR 1173 and IRGACURE OXE 01, IRGACURE 907 and LUCIRIN TPO, and IRGACURE 907 and IRGACURE 819. By using such a combination, an exposure margin can be expanded.

A proportion of the photoradical polymerization initiator in the curable composition for imprinting according to the embodiment of the present invention is preferably 0.01% to 10% by mass, more preferably 0.1% to 5% by mass, and still more preferably 0.5% to 3% by mass. The curable composition for imprinting may contain only one kind or two or more kinds of the photopolymerization initiators. In a case where two or more kinds thereof are contained, the total amount thereof is preferably within the above range.

<Release Agent>

The curable composition for imprinting according to the embodiment of the present invention may contain a release agent.

The release agent used in the present invention is not particularly specified as long as a type thereof does not depart from the spirit of the present invention, but preferably means an additive having a function of segregating at an interface with the mold to promote release from the mold. Specific examples thereof include a surfactant, and a non-polymerizable compound (hereinafter, referred to as a "non-polymerizable compound having releasability" in some cases) which has a polyalkylene glycol structure having at least one hydroxyl group at the terminal or having an etherified hydroxyl group, and does not substantially contain a fluorine atom and a silicon atom.

Only one kind or two or more kinds of the release agents may be contained. Moreover, in a case where the release agent is contained, a total content thereof in the solid content is preferably 0.1% to 20% by mass, more preferably 0.5% to 10% by mass, and still more preferably 1% to 5% by mass.

<<Surfactant>>

As a surfactant, a nonionic surfactant is preferable.

The nonionic surfactant is a compound having at least one hydrophobic moiety and at least one nonionic hydrophilic moiety. The hydrophobic moiety and the hydrophilic moiety may each be at a terminal of a molecule, or an inside thereof. The hydrophobic moiety is constituted of a hydrophobic group selected from a hydrocarbon group, a fluorine-containing group, and a Si-containing group, and the number of carbon atoms in the hydrophobic moiety is preferably 1 to 25, more preferably 2 to 15, still more preferably 4 to 10, and even more preferably 5 to 8. The nonionic hydrophilic moiety preferably has at least one group selected from the group consisting of an alcoholic hydroxyl group, a phenolic hydroxyl group, an ether group (preferably, a polyoxyalkylene group and a cyclic ether group), an amide group, an imide group, a ureido group, a urethane group, a cyano group, a sulfonamide group, a lactone group, a lactam group, and a cyclocarbonate group. The nonionic surfactant may be a hydrocarbon-based, fluorine-based, Si-based, or fluorine and Si-based nonionic surfactant, but is more preferably a fluorine-based or Si-based nonionic surfactant and still more preferably a fluorine-based nonionic surfactant. Here, the "fluorine and Si-based nonionic surfactant" refers to a surfactant satisfying requirements of both a fluorine-based nonionic surfactant and a Si-based nonionic surfactant.

Examples of a commercially available product of the fluorine-based nonionic surfactant include FLUORAD FC-4430 and FC-4431 produced by Sumitomo 3M Limited, SURFLON S-241, S-242, S-243, and S-650 produced by ASAHI GLASS CO., LTD., EFTOP EF-PN31M-03, EF-PN31M-04, EF-PN31M-05, EF-PN31M-06, and MF-100 produced by Mitsubishi Materials Electronic Chemicals Co., Ltd., Polyfox PF-636, PF-6320, PF-656, and PF-6520 produced by OMNOVA Solutions Inc., FUTARGENT 250, 251, 222F, and 212M DFX-18 produced by NEOS COMPANY LIMITED, UNIDYNE DS-401, DS-403, DS-406, DS-451, and DSN-403N produced by DAIKIN INDUSTRIES, LTD., MEGAFACE F-430, F-444, F-477, F-553, F-556, F-557, F-559, F-562, F-565, F-567, F-569, and R-40 produced by DIC Corporation, and Capstone FS-3100 and Zonyl FSO-100 produced by DuPont.

In a case where the curable composition for imprinting according to the embodiment of the present invention contains a surfactant, a content of the surfactant is preferably 0.1% to 10% by mass, more preferably 0.2% to 5% by mass, and still more preferably 0.5% to 5% by mass in the entire composition excluding a solvent. The curable composition for imprinting may contain only one kind or two or more kinds of the surfactants. In a case where two or more kinds thereof are contained, the total amount thereof is preferably within the above range.

<<Non-Polymerizable Compound Having Releasability>>

The curable composition for imprinting may contain a non-polymerizable compound which has a polyalkylene glycol structure having at least one hydroxyl group at the terminal or having an etherified hydroxyl group, and does not substantially contain a fluorine atom and a silicon atom. Here, the non-polymerizable compound refers to a compound having no polymerizable group. Moreover, regarding the non-polymerizable compound, the expression "does not substantially contain a fluorine atom and a silicon atom" indicates, for example, that a total content ratio of the fluorine atom and the silicon atom is 1% by mass or less, and it is preferable that a fluorine atom and a silicon atom are not contained at all. By not having a fluorine atom and a silicon atom, compatibility with the polymerizable compound is improved, and particularly in the curable composition for imprinting which does not substantially contain a solvent, coating uniformity, pattern formability during imprinting, and line edge roughness after dry etching are improved.

The polyalkylene glycol structure of the non-polymerizable compound having releasability is preferably a polyalkylene glycol structure including an alkylene group having 1 to 6 carbon atoms, more preferably a polyethylene glycol structure, a polypropylene glycol structure, a polybutylene glycol structure, or a mixed structure thereof, still more preferably a polyethylene glycol structure, a polypropylene glycol structure, or a mixed structure thereof, and even more preferably a polypropylene glycol structure.

Furthermore, the non-polymerizable compound may be substantially constituted of only a polyalkylene glycol structure, except for a substituent at a terminal. Here, the expression "substantially" means that constituent elements other than the polyalkylene glycol structure account for 5% by mass or less and preferably 1% by mass or less of the entire compound. It is particularly preferable to include a compound substantially consisting of a polypropylene glycol structure as the non-polymerizable compound having releasability.

The number of alkylene glycol constitutional units included in the polyalkylene glycol structure is preferably 3 to 100, more preferably 4 to 50, still more preferably 5 to 30, and even more preferably 6 to 20.

The non-polymerizable compound having releasability preferably has at least one hydroxyl group at the terminal or has an etherified hydroxyl group. In a case where the non-polymerizable compound has at least one hydroxyl group at the terminal or has an etherified hydroxyl group, the remaining terminals may be hydroxyl groups, or a hydrogen atom of the terminal hydroxyl group may be substituted. As a group in which a hydrogen atom of the terminal hydroxyl group may be substituted, an alkyl group (that is, polyalkylene glycol alkyl ether) and an acyl group (that is, polyalkylene glycol ester) are preferable. A compound having a plurality of (preferably, two or three) polyalkylene glycol chains via a linking group can also be preferably used.

Preferred specific examples of the non-polymerizable compound having releasability include polyethylene glycol, polypropylene glycol (for example, produced by FUJIFILM Wako Pure Chemical Corporation), mono or dimethyl ether thereof, mono or dibutyl ether, mono or dioctyl ether, mono or dicetyl ether, monostearate, monooleate, polyoxyethylene glyceryl ether, polyoxypropylene glyceryl ether, polyoxyethylene lauryl ether, and trimethyl ether thereof.

A weight-average molecular weight of the non-polymerizable compound having releasability is preferably 150 to 6,000, more preferably 200 to 3,000, still more preferably 250 to 2,000, and even more preferably 300 to 1,200.

In addition, examples of a commercially available product of the non-polymerizable compound having releasability which can be used in the present invention include OLFINE E1010 (produced by Nissin Chemical Co., Ltd.) and Brij35 (produced by Kishida Chemical Co., Ltd.).

In a case where the curable composition for imprinting according to the embodiment of the present invention contains the non-polymerizable compound having releasability, a content of the non-polymerizable compound having releasability is preferably 0.1% by mass or greater, more preferably 0.5% by mass or greater, still more preferably 1.0% by mass or greater, and even more preferably 2% by mass or greater in the entire composition excluding a solvent. Moreover, the content is preferably 20% by mass or less, more preferably 10% by mass or less, and still more preferably 5% by mass or less.

The curable composition for imprinting may contain only one kind or two or more kinds of the non-polymerizable compounds having releasability. In a case where two or more kinds thereof are contained, the total amount thereof is preferably within the above range.

<Other Components>

The curable composition for imprinting according to the embodiment of the present invention may contain a sensitizer, an antioxidant, an ultraviolet absorber, a solvent, a polymer, or the like, in addition to the aforementioned components. Only one kind or two or more kinds of the respective compounds may be contained. For the details thereof, reference can be made to the description in paragraphs 0061 to 0064 of JP2014-170949A, the contents of which are incorporated in the present specification.

<<Solvent>>

The curable composition for imprinting according to the embodiment of the present invention may contain a solvent. Examples of the solvent include propylene glycol monomethyl ether acetate, cyclohexanone, 2-heptanone, γ-butyrolactone, propylene glycol monomethyl ether, and ethyl lactate. In a case where the solvent is contained, a content thereof is preferably 1% to 20% by mass with respect to the composition. Only one kind or two or more kinds of the solvents may be contained. In a case where two or more kinds thereof are contained, the total amount thereof is preferably within the above range.

Furthermore, in the present invention, a configuration in which a solvent is not substantially contained can also be adopted. The expression "solvent is not substantially contained" means that the content of the solvent is 5% by mass or less, and the content is preferably 3% by mass or less and more preferably 1% by mass or less.

<<Polymer>>

The curable composition for imprinting according to the embodiment of the present invention may contain a polymer. The polymer is, for example, a component having a weight-average molecular weight of 2,000 or greater, and preferably a component having a weight-average molecular weight of greater than 2,000.

Furthermore, in the present invention, a configuration in which a polymer is not substantially contained can also be adopted. The expression "polymer is not substantially contained" means that the content of the polymer is 5% by mass or less, and the content is preferably 3% by mass or less and more preferably 1% by mass or less.

<Characteristics of Curable Composition for Imprinting>

The curable composition for imprinting according to the embodiment of the present invention is usually a curable composition for imprinting which is cured by light.

As one embodiment of the curable composition for imprinting according to the embodiment of the present invention, an aspect in which a silicon atom is not substantially contained is exemplified. The expression "silicon atom is not substantially contained" means that a content of the silicon atom in the composition is 1% by mass or less, and the content is preferably 0.5% by mass or less, more preferably 0.1% by mass or less, and still more preferably 0.01% by mass or less.

Moreover, a content of a silicon-containing component in the curable composition for imprinting according to the embodiment of the present invention is preferably 5% by mass or less, more preferably 3% by mass or less, and still more preferably 1% by mass or less. In particular, in the present invention, it is preferable that a silicone-based resin satisfies the above range. With such a configuration, it is possible to sufficiently secure an etching selection ratio with an object to be processed (for example, silicon, a silicon oxide, a spin-on glass material, and the like) in a case of manufacturing a device.

An acid value of the composition according to the embodiment of the present invention is preferably 2 mmol/g or less, more preferably 1 mmol/g or less, still more preferably 0.5 mmol/g or less, even more preferably 0.1 mmol/g or less, and further still more preferably 0.01 mmol/g or less. As the lower limit value thereof, 0 mmol/g is ideal but 0.001 mmol/g or greater is also a sufficiently preferred level.

Similarly, an amine value is also preferably 2 mmol/g or less, more preferably 1 mmol/g or less, still more preferably 0.5 mmol/g or less, even more preferably 0.1 mmol/g or less, and further still more preferably 0.01 mmol/g or less. As the lower limit value thereof, 0 mmol/g is ideal but 0.001 mmol/g or greater is also a sufficiently preferred level.

An ion exchange resin is widely used as a method for removing metal component-derived impurities from a chemical liquid. However, in a case where the ion exchange resin is used, a trace amount of a resin component is eluted into the chemical liquid in some cases. Many of the eluted substances have an ion exchange group (for example, a sulfo group, a carboxyl group, a quaternary ammonium group, or a primary to tertiary amino group). For the reason, in a case where the eluted substance is contained in the curable composition for imprinting, the eluted substance is adsorbed on a surface of the mold during the contact with the mold, and thus deterioration in releasability or contamination of the surface of the mold is caused in some cases. Therefore, it is preferable to suppress an amount of the eluted substance in the curable composition for imprinting to be equal to or less than a certain amount.

<Method for Producing Curable Composition for Imprinting>

The curable composition for imprinting according to the embodiment of the present invention is prepared by formulating raw materials in a predetermined ratio. The raw materials refer to components which are actively formulated in the curable composition for imprinting, and in which unintentionally contained components such as impurities are excluded. Specific examples thereof include a polymerizable compound, a photopolymerization initiator, and a release agent. Here, the raw materials may be commercially available products or synthetic products. All the raw materials usually contain particles containing impurities (the specific particulate metal, a particulate metal other than the specific particulate metal, or other impurities), and the like. Accordingly, as one preferred embodiment of a method for producing the curable composition for imprinting according to the embodiment of the present invention, an aspect including using raw materials (a polymerizable compound and a photopolymerization initiator, and other components formulated accordingly) subjected to at least one of a distillation treatment or an acid cleaning treatment is exemplified. By performing such a treatment, impurities can be effectively removed. In particular, metal species, which are easily mixed and have a large influence on an imprint performance in a case of being mixed, are iron, copper, titanium, and lead, and in addition to these metals, sodium, potassium, calcium, magnesium, manganese, aluminum, lithium, chromium, nickel, tin, zinc, arsenic, silver, gold, cadmium, cobalt, vanadium, and tungsten are also included. As a removal treatment of these metals, distillation or acid cleaning is effective. In particular, it is preferable to perform at least one of the distillation treatment or the acid cleaning treatment on the polymerizable compound and the photopolymerization initiator contained in the curable composition for imprinting, and more preferable to perform at least one of the distillation treatment or the acid cleaning treatment on all the raw materials contained in the curable composition for imprinting.

The distillation treatment is preferably distillation under reduced pressure, and a pressure thereof is preferably 0.1 kPa or greater, more preferably 0.3 kPa or greater, and still more preferably 0.5 kPa or greater. Meanwhile, the upper limit value thereof is preferably 10.0 kPa or less, more preferably 5.0 kPa or less, and still more preferably 1.0 kPa or less. Furthermore, two or more stages of distillation under reduced pressure may be performed by changing the pressure.

A distillation point of the distillation treatment is not particularly specified, but is more preferably 80° C. to 200° C. and still more preferably 80° C. to 180° C. Moreover, based on a boiling point of a target raw material under the reduced pressure, the distillation point is preferably the boiling point+1° C. or higher, more preferably the boiling point+5° C. or higher, and still more preferably the boiling point+10° C. or higher. The upper limit of the distillation point is not particularly specified, but is preferably the boiling point+50° C. or lower, more preferably the boiling point+30° C. or lower, and still more preferably the boiling point+20° C. or lower.

The distillation treatment is suitable for the compound which is a liquid at 23° C. Moreover, the distillation treatment is effective in reducing impurities in the polymerizable compound and the polymerization initiator.

In a case where a raw material to be distilled is the polymerizable compound, it is preferable to add a polymerization inhibitor to perform distillation. In a case where the amount of the specific particulate metal is reduced by distillation, the polymerizable compound (preferably, a (meth)acrylate compound) is polymerized in a distillation pot or a distillation column in some cases. In a case where polymerization is performed in the distillation pot or the distillation column, the equipment needs to be stopped for repairing, and thus productivity is significantly reduced. Therefore, in a case of distillation, it is preferable to add a polymerization inhibitor. Examples of the polymerization inhibitor include an N-oxyl compound, and a 4-hydroxy-2,2,6,6-tetramethylpiperidine-1-oxyl free radical is preferable. Moreover, specific examples of other polymerization inhibitors include the polymerization inhibitor described in paragraph 0121 of JP2012-169462A, the contents of which are incorporated in the present specification.

An amount of the polymerization inhibitor is preferably 10 to 500 ppm by mass with respect to 100 parts by mass of the polymerizable compound which is a raw material. The upper limit thereof is, for example, preferably 400 ppm by mass or less and more preferably 300 ppm by mass or less. The lower limit thereof is, for example, preferably 25 ppm by mass or greater and more preferably 50 ppm by mass or greater. By setting the amount within the above range, polymerization of the polymerizable compound can be efficiently prevented while suppressing the amount of the polymerization inhibitor in a distillate.

As the acid cleaning treatment, an aspect in which an organic solvent, in which a raw material to be cleaned is dissolved, and an acidic aqueous solution are mixed and stirred, and then left to stand, and in a two-phase separation state, a water phase, in which a specific particulate metal or a metal other than the specific particulate metal is dissolved, is removed is exemplified. By repeating this operation a plurality of times, the amount of the specific particulate metal or the metal other than the specific particulate metal in the raw material can be effectively reduced. Performing liquid separation purification using ion exchange water after the operation is preferable. By performing the liquid separation purification using the ion exchange water, a trace amount of an acid component eluted into a solvent phase can be effectively reduced.

The organic solvent is preferably a water-insoluble solvent which dissolves the raw materials and does not dissolve water. Specific examples thereof include an apolar solvent such as hexane, benzene, and toluene, an ether-based solvent such as ether, diethyl ether, methyl ethyl ether, and cyclopentyl methyl ether, and an ester-based solvent such as ethyl acetate and butyl acetate, and an ester-based solvent is preferable.

Furthermore, specific examples of the acidic aqueous solution include a hydrogen chloride aqueous solution (hydrochloric acid), a nitric acid aqueous solution, an oxalic acid aqueous solution, and a citric acid aqueous solution. Normality of the acidic aqueous solution is preferably 0.1 to 10 N, more preferably 0.3 to 5 N, and still more preferably 0.5 to 3 N. In a case where the normality is greater than the above range, the acid component remains in an organic solvent phase, and thus purity is reduced. Moreover, in a case where the normality is less than the above range, a particulate metal-removing ability is degraded.

The acid cleaning treatment is suitable for reducing impurities in the polymerization initiator and the release agent.

In the production method according to the embodiment of the present invention, it is preferable that raw materials contained in the composition according to the embodiment of the present invention are mixed and then subjected to a filtration treatment with a filter. The filtration with a filter is preferably performed after the raw materials of the curable composition for imprinting are mixed. The filter preferably has an adsorptive group capable of adsorbing the specific particulate metal (preferably, the specific particulate metal and the particulate metal including a metal other than the specific particulate metal). Examples of such a filter include a filter containing polyamide.

Effects of filtration are exhibited even with one stage of a filter, but filtration with two or more stages of filters is more preferable. The filtration with two or more stages of filters refers to filtration in a state where two or more filters are arranged in series. In the present invention, filtration with one to four stages of filters is preferable, and filtration with two to four stages of filters is more preferable.

A component (material component) constituting the material for the filter preferably contains a resin. The resin is not particularly limited, and resins known as the material for the filter can be used. Specific examples thereof include polyamide such as 6-polyamide and 6,6-polyamide, polyolefin such as polyethylene and polypropylene, polystyrene, polyimide, polyamide imide, poly(meth)acrylate, polyfluorocarbon such as polytetrafluoroethylene, perfluoroalkoxy alkane, a perfluoroethylenepropene copolymer, an ethylene-tetrafluoroethylene copolymer, an ethylene-chlorotrifluoroethylene copolymer, polychlorotrifluoroethylene, polyvinylidene fluoride, and polyvinyl fluoride, polyvinyl alcohol, polyester, cellulose, cellulose acetate, polysulfone, and polyether sulfone. Among them, from the viewpoints that superior solvent resistance is exhibited and a superior defect-suppressing performance is exhibited, at least one kind selected from the group consisting of polyamide (in particular, 6,6-polyamide is preferable), polyolefin (in particular, polyethylene is preferable), polyfluorocarbon (in particular, polytetrafluoroethylene (PTFE) and perfluoroalkoxy alkane (PFA) are preferable), polystyrene, polysulfone, and polyether sulfone is preferable, at least one kind selected from the group consisting of polyolefin and polyamide is more preferable, at least one kind selected from the group consisting of polyethylene (including polyethylene having an ultra-high molecular weight and grafted polyethylene), polyamide, and polytetrafluoroethylene is still more preferable, and at least one kind selected from the group consisting of polyethylene (including polyethylene having an ultra-high molecular weight and grafted polyethylene) and polyamide is even more preferable. These polymers can be used singly or in combination of two or more kinds thereof.

In addition, as one preferred embodiment of the component (material component) constituting the material for the filter, a polymer (grafted polymer) in which at least one kind of neutral groups is grafted can be mentioned. The neutral group is preferably at least one kind selected from a hydroxyl group or a carboxyl group, and more preferably a hydroxyl group.

The grafted polymer is preferably a grafted polyolefin and more preferably a grafted polyethylene.

For the description of the grafted polymer, reference can be made to the description in WO2016/081729A, the contents of which are incorporated in the present specification.

The filter used in the present invention is preferably a polyamide-made filter from the viewpoint that the specific particulate metal and the particulate metal including a metal other than the specific particulate metal in the curable composition for imprinting are efficiently removed. The polyamide-made filter adsorbs the specific particulate metal and the particulate metal including a metal other than the specific particulate metal in the curable composition for imprinting, by a van der Waals force, an electrostatic force, and the like. Moreover, the polyamide-made filter also adsorbs a particulate metal containing an organic compound which can be a defect during imprinting. Examples of the material of the polyamide-made filter include polyamide such as polyamide 6 and polyamide 6,6, but are not limited to these examples. Furthermore, the material may form a porous film of a filter as a resin, or may coat or be supported on a porous film formed of another resin. A filter, which is coated with and supports the material, improves mobility of a functional group that adsorbs the specific particulate metal and the particulate metal including a metal other than the specific particulate metal, and thus an ability to capture the specific particulate metal and the particulate metal including a metal other than the specific particulate metal is extremely high. Specific examples of the filter, which is coated with and supports the material, include a neutral group-containing graft polyethylene filter on which a neutral group is supported and which is described in paragraphs 0058 and 0059 of JP2017-536232A.

A pore diameter of the filter is preferably 100 nm or smaller, more preferably 20 nm or smaller, still more preferably 12 nm or smaller, and even more preferably 8 nm or smaller, and may be 5 nm or smaller. By setting the pore diameter of the filter to 100 nm or smaller, the specific particulate metal and the particulate metal including a metal other than the specific particulate metal can be more effectively reduced. Moreover, the lower limit value of the pore diameter of the filter is not particularly specified, but is, for example, preferably 1 nm or larger. By setting the pore diameter of the filter to 1 nm or larger, an unnecessarily large pressure is not applied during filtration, productivity is improved, and breakage of a filter can be effectively suppressed. In a case where the filtration is performed stepwise, a filter having a pore diameter of 100 to 7 nm (preferably, a filter having a pore diameter of 20 to 7 nm) can be used in first-stage filtration, and a filter having a pore diameter of smaller than 7 nm (preferably, a filter having a pore diameter of smaller than 7 nm and 1 nm or larger) can be used in second-stage filtration. Moreover, a difference in the pore diameter from the immediately preceding stage, such as between the first stage and the second stage and between the second stage and the third stage, is preferably 1 to 8 nm.

A supply pressure of the curable composition for imprinting to the filter is not particularly limited, but is generally preferably 0.001 to 2.0 MPa. Among them, from the viewpoint that the specific particulate metal can be more effectively removed, the supply pressure is preferably 0.001 to 1.5 MPa, more preferably 0.01 to 1.2 MPa, still more preferably 0.05 to 1.0 MPa, and even more preferably 0.1 to 1.0 MPa.

Furthermore, since the filtration pressure affects filtration accuracy, it is preferable that the pressure pulsation during filtration is as small as possible. Differential pressure resistance which ensures a filter performance (the filter is not broken) is set for the filter, and in a case where the value is large, the filtration pressure is increased, and thus the filtration rate can be increased. That is, the upper limit of the filtration rate usually depends on the differential pressure resistance of the filter, but is usually preferably 10.0 L/min or lower, more preferably 1.0 L/min or lower, and still more preferably 0.5 L/min or lower. The lower limit value thereof is, for example, 0.001 L/min or higher, and more preferably 0.01 L/min or higher.

A temperature in a case where the curable composition for imprinting is passed through the filter is not particularly limited, but is generally preferably 20° C. to 30° C.

In addition, a filtration step is preferably performed in a clean environment. Specifically, the filtration step is preferably performed in a clean room satisfying Class 1000 (Class 6 in ISO 14644-1:2015) of Federal Specifications and Standards (Fed. Std. 209E), and a clean room satisfying Class 100 (Class 5 in ISO 14644-1:2015) is more preferable, a clean room satisfying Class 10 (Class 4 in ISO 14644-1:2015) is still more preferable, and a clean room having a cleanliness (Class 2 or Class 1) of Class 1 (Class 3 in ISO 14644-1:2015) or higher is particularly preferred.

Circulation filtration may be adopted as the filtration step. The number of times of the circulation filtration is not particularly limited, but is generally preferably 2 to 4 times.

As described above, as the method for reducing the specific particulate metal and the particulate metal including a metal other than the specific particulate metal from the chemical liquid, the ion exchange resin which has been widely used in the related art can also be used. However, in a case where an attempt is made to reduce impurities using the ion exchange resin, a resin component of the ion exchange resin is eluted into the chemical liquid in some cases. Therefore, in the present invention, in a case where the ion exchange resin is used, a combined use with other reduction methods is required after a treatment with the ion exchange resin is performed.

Furthermore, the method for producing the curable composition for imprinting according to the embodiment of the present invention can also adopt an aspect in which the ion exchange resin is not used.

As a first embodiment of the method for producing the curable composition for imprinting according to the embodiment of the present invention, an aspect in which the ion exchange resin is added to the curable composition for imprinting, and the resultant is stirred and then filtered with a filter containing a resin can be mentioned. The filtration with the resin filter at that time is preferably filtration with two or more stages of filters and more preferably filtration with two to four stages of filters. Moreover, in a case where the filtration with two or more stages of filters is performed, it is preferable that filters made of different materials are used in the first stage and the second stage. Examples thereof include an aspect in which a polyethylene filter is used in first-stage filtration and then a polyamide filter is used.

A second embodiment of the method for producing the curable composition for imprinting according to the embodiment of the present invention is an aspect including mixing the raw materials of the curable composition for imprinting with a raw material subjected to at least one of the distillation treatment or the acid cleaning treatment. In the second embodiment, it is preferable that the raw material subjected to at least one of the distillation treatment or the acid cleaning treatment is mixed and then subjected to the filtration treatment with a filter.

The filtration treatment is preferably a filtration treatment with a filter containing polyamide, a filtration treatment with a filter containing polyolefin, and a filtration treatment with a filter containing polyolefin in which at least one kind of a neutral group or an ion exchange group is grafted, and it is more preferable that the filtration treatment with a filter containing polyolefin is performed and then the filtration treatment with a filter containing polyolefin in which at least one kind of a neutral group or an ion exchange group is grafted is performed.

In the present invention, the second embodiment is particularly preferable.

The production method according to the embodiment of the present invention is also suitable for a method for producing the curable composition for imprinting, which does not substantially contain a silicon atom.

The method for producing the curable composition for imprinting according to the present embodiment may include steps other than the aforementioned steps. Examples of the steps other than the aforementioned steps include a filter cleaning step, a device cleaning step, an electricity removing step, and a purified liquid preparation step.

<Storage Container>

As a storage container of the curable composition for imprinting according to the embodiment of the present invention, a storage container known in the related art can be used. Moreover, as the storage container, for the purpose of preventing impurities from being mixed into a raw material or a composition, a multilayer bottle having a container inner wall made of six layers of six kinds of resins or a bottle having a seven-layer structure of six kinds of resins is also preferably used. Examples of such a container include the container described in JP2015-123351A.

The curable composition for imprinting according to the embodiment of the present invention is used as a cured product. More specifically, a cured product (pattern) is formed by an optical imprint method and then used.

<Pattern Producing Method>

A pattern producing method according to the embodiment of the present invention includes applying the curable composition for imprinting according to the embodiment of the present invention onto a substrate or a mold and irradiating the curable composition for imprinting with light in a state of being sandwiched between the mold and the substrate.

In the pattern producing method according to the embodiment of the present invention, a pattern is applied onto the substrate or the mold. The application method is not particularly specified, reference can be made to the description in paragraph 0102 of JP2010-109092A (the corresponding US application is US2011/0199592A), the contents of which are incorporated in the present specification. In the present invention, a spin coating method or an ink jet method is preferable.

The substrate is not particularly specified, reference can be made to the description in paragraph 0103 of JP2010-109092A (the corresponding US application is US2011/0199592A), the contents of which are incorporated in the present specification. Specific examples thereof include a silicon substrate, a glass substrate, a sapphire substrate, a silicon carbide (silicon carbide) substrate, a gallium nitride substrate, a metal aluminum substrate, an amorphous aluminum oxide substrate, a polycrystalline aluminum oxide substrate, and a substrate made of GaAsP, GaP, AlGaAs, InGaN, GaN, AlGaN, ZnSe, AlGalnP, or ZnO. Furthermore, specific examples of a material of the glass substrate include aluminosilicate glass, aluminoborosilicate glass, and barium borosilicate glass.

In the present invention, a silicon substrate is preferable.

The mold is not particularly specified, reference can be made to the description in paragraphs 0105 to 0109 of JP2010-109092A (the corresponding US application is US2011/0199592A), the contents of which are incorporated in the present specification. In the present invention, a quartz mold is preferable. A pattern (line width) of the mold used in the present invention preferably has a size of 50 nm or less.

The curable composition for imprinting is irradiated with light in a state of being sandwiched between the mold and the substrate. A step of performing pressure contact with the substrate or the mold can be preferably performed under a rare gas atmosphere, under a reduced-pressure atmosphere, or under a pressure-reduced rare gas atmosphere. Here, the reduced-pressure atmosphere means a state in a space filled with a pressure lower than the atmospheric pressure (101, 325 Pa), and the pressure is preferably 1,000 Pa or lower, more preferably 100 Pa or lower, and still more preferably 1 Pa or lower. In a case where the rare gas is used, helium is preferable. An exposure dose is desirably in a range of 5 mJ/cm$^2$ to 1,000 mJ/cm$^2$.

Here, the curable composition for imprinting according to the embodiment of the present invention is preferably cured by further heating after light irradiation. Moreover, an underlayer film or an adhesive film may be provided between the substrate and a layer of the curable composition for imprinting, by using an composition for forming an underlayer film or a composition for forming an adhesive film. That is, the curable composition for imprinting (further, a cured product according to the embodiment of the present invention) may be provided directly on the surface of the substrate or the mold, or may be provided on the substrate or the mold via one or more layers.

As the composition for forming an underlayer film used in the present invention, a composition containing, in a proportion of 50 ppt by mass to 10 ppb by mass in total with respect to the solid content, a particulate metal which has a particle diameter of 10 nm or larger, as measured by the single particle ICP-MASS method, and includes at least one kind of iron, copper, titanium, or lead may be used. Furthermore, in the composition for forming an underlayer film used in the present invention, it is more preferable that a total amount of the particulate metal which has a particle diameter of 10 nm or larger, as measured by the single particle ICP-MASS method, and includes at least one kind of iron, copper, titanium, or lead and a particulate metal which is other than the aforementioned particulate metal, has a particle diameter of 1 nm or larger, as measured by the single particle ICP-MASS method, and includes at least one kind of sodium, potassium, calcium, magnesium, aluminum, lithium, chromium, nickel, tin, zinc, arsenic, silver, gold, cadmium, cobalt, vanadium, or tungsten is 100 ppt by mass to 30 ppb by mass with respect to the solid content. By using such a composition for forming an underlayer film, the effects of the present invention are more effectively exhibited.

In addition to the aforementioned matters, for details of the pattern producing method, reference can be made to the description in paragraphs 0103 to 0115 of JP2010-109092A (the corresponding US application is US2011/0199592A), the contents of which are incorporated in the present specification.

In the pattern producing method according to the embodiment of the present invention, a fine pattern can be formed at low cost and with high accuracy by the optical imprint method (more preferably, an optical nanoimprint method). Therefore, the pattern, which was used to be formed by using the photolithography technique in the related art, can be formed with higher accuracy and at lower cost. As an example, the method is used for manufacturing a semiconductor element. That is, the present invention also discloses a method for manufacturing a semiconductor element, which includes the pattern producing method according to the embodiment of the present invention. More specifically, the pattern of the present invention is preferably used as an etching resist (etching mask). In particular, the pattern can also be applied as a permanent film, such as an overcoat layer or an insulating film, used in a liquid crystal display (LCD) or the like, or an etching resist such as a semiconductor integrated circuit, a recording material, or a flat panel display. In particular, the pattern obtained by the pattern producing method according to the embodiment of the present invention also has excellent etching resistance, and thus can also be preferably used as an etching resist for dry etching using fluorocarbon or the like.

<Pattern>

As described above, the pattern formed by the pattern producing method according to the embodiment of the present invention can be used as a permanent film used in an LCD or the like, or an etching resist for semiconductor processing. Moreover, a grid pattern is formed on a glass substrate of the LCD using the pattern of the present invention, and thus a polarizing plate having low reflection or absorption and a large screen size (for example, 55 inches, or greater than 60 inches) can be manufactured at low cost. For example, the polarizing plate described in JP2015-132825A or WO2011/132649A can be manufactured. Furthermore, 1 inch is 25.4 mm.

In addition, after the production, the curable composition for imprinting is bottled in a container such as a gallon bottle or a coated bottle, transported, and stored, but in this case, for the purpose of preventing deterioration, the inside of the container may be replaced with inert nitrogen, argon, or the like. Moreover, during the transportation and the storage, the temperature may be a normal temperature, but in order to further prevent degeneration of the curable composition for imprinting, the temperature may be controlled to be in a range of −20° C. to 0° C. It goes without saying that blocking light at a level at which the reaction does not proceed is preferable.

Specifically, the pattern of the present invention can be preferably used for producing a recording medium such as a magnetic disc, a light-receiving element such as a solid-state imaging element, a light emitting element such as an LED and organic EL, an optical device such as an LCD, an optical component such as a diffraction grating, a relief hologram, an optical waveguide, an optical filter, and a microlens array, a member for flat panel display such as a thin film transistor, an organic transistor, a color filter, an antireflection film, a polarizing plate, a polarizing element, an optical film, and a column material, a nanobiodevice, an immunoassay chip, a deoxyribonucleic acid (DNA) separation chip, a microreactor, a photonic liquid crystal, or a guide pattern for fine pattern formation (directed self-assembly, DSA) using self-assembly of block copolymers.

The pattern formed by the pattern producing method according to the embodiment of the present invention is also useful as an etching resist (mask for lithography). In a case where the pattern is used as an etching resist, first, a silicon substrate (silicon wafer or the like) in which a thin film of $SiO_2$ or the like is formed or the like is used as a substrate, and a fine pattern of, for example, a nano or micro order is formed on the substrate by the pattern producing method according to the embodiment of the present invention. In the present invention, the pattern producing method is particularly advantageous in that a fine pattern of a nano order can be formed, and a pattern having a size of 100 nm or less, further 50 nm or less, and particularly 30 nm or less can also be formed. The lower limit value of the size of the pattern formed by the pattern producing method according to the embodiment of the present invention is not particularly specified, but can be, for example, 1 nm or greater. A shape of the pattern is not particularly specified, but, for example, an aspect including at least one shape of a line, a hole, or a pillar is exemplified.

Thereafter, by performing etching with an etching gas such as hydrogen fluoride or the like in a case of wet etching and $CF_4$ or the like in a case of dry etching, a desired pattern can be formed on the substrate. The pattern has favorable etching resistance particularly to dry etching. That is, the pattern obtained by the production method according to the embodiment of the present invention is preferably used as an etching mask. Moreover, the present invention also discloses a method for manufacturing a semiconductor element, in which etching is performed using, as a mask, the pattern obtained by the production method according to the embodiment of the present invention.

EXAMPLES

Hereinafter, the present invention will be described in more detail with reference to Examples. The materials, the used amounts, the ratios, the treatment details, the treatment procedures, and the like shown in the following Examples can be appropriately modified without departing from the spirit of the present invention. Therefore, the scope of the present invention is not limited to the specific examples described below. The Examples were carried out under a condition of 23° C., unless otherwise specified.

Comparative Example 1

<Preparation of Curable Composition for Imprinting>

The following components were formulated in a perfluoroalkoxy alkane (PFA)-made bottle, which had been subjected to an acid cleaning treatment, to prepare a curable composition for imprinting.
 1,3-Phenylene bis(methylene) diacrylate 50 parts by mass
 Neopentylglycol diacrylate 30 parts by mass
 Lauryl acrylate 15 parts by mass
 IRGACURE 819 (produced by BASF SE) 2 parts by mass
 Polypropylene glycol (Mw=700) (produced by NOF CORPORATION) 3 parts by mass <Measurement of Concentration of Particulate Metal Including Metal>

A concentration of a particulate metal including a metal in the curable composition for imprinting was measured using ICP-MS.

Specifically, ICP-MS ("Agilent 8800 TRIPLE QUADRU-POLE ICP-MS (for semiconductor analysis, option #200)") was used. As the sample introduction system, a quartz torch, a coaxial perfluoroalkoxy alkane (PFA) nebulizer (for self-priming), and a platinum interface cone were used.

Measurement parameters of a cool plasma condition are as follows.

A content of a particulate metal of 1 nm or larger was calculated from the particle diameter distribution of the particulate metal obtained by the measurement. The unit was ppt by mass or ppb by mass.

The measured metals were Na, K, Ca, Fe, Cu, Mg, Mn, Al, Li, Cr, Ni, Sn, Zn, As, Au, Ag, Cd, Co, Pb, Ti, V, and W.
 Output of radio frequency (RF): 600 W
 Flow rate of carrier gas: 0.7 L/min
 Flow rate of make-up gas: 1 L/min
 Sampling depth: 18 mm <Measurement of Acid Value>

The acid value of the curable composition for imprinting was measured in accordance with JIS K 2501-2003.

Specifically, the curable composition for imprinting was dissolved in a titration solvent in which xylene and dimethylformamide were mixed in a ratio (mass ratio) of 1:1, and titrated with a 0.01 mol/L potassium hydroxide-ethanol solution by a potentiometric titration method, and an inflection point on a titration curve was taken as an end point. The acid value was calculated from the amount titrated to the end point of the potassium hydroxide solution.

<Measurement of Amine Value>

After the curable composition for imprinting was sufficiently stirred, 15.0 g of the composition was weighed, and 50 mL of acetic acid was added to obtain a sample solution. The sample solution was potentiometrically titrated with a 0.005 mol/L perchloric acid/acetic acid solution, and an amine value was measured from the following calculation expression. A blank test (test in which the curable composition for imprinting was not added) was also separately carried out.

Amine value (µmol/g)=(V−VB)×f×5/W
 V: Amount (unit: mL) of the 0.005 mol/L perchloric acid/acetic acid solution required for the titration of the sample
 VB: Amount (unit: mL) of the 0.005 mol/L perchloric acid/acetic acid solution required for the titration of the blank test
 f: Titer of the 0.005 mol/L perchloric acid/acetic acid solution
 W: Collection amount (g) of the sample <Evaluation of Etching Resistance>

As the quartz mold, a quartz mold having a hole pattern, which had a hole diameter of 40 nm and a pitch of 80 nm and was arranged in a lattice form, was used.

A silicon wafer was spin-coated with the composition for forming an adhesive film shown in Example 6 of JP2014-024322A, and heated for 1 minute using a hot plate at 220° C. to form an adhesive film having a thickness of 5 nm. The curable composition for imprinting was applied onto the wafer on which the adhesive film was formed by the ink jet method using an ink jet printer DMP-2831 manufactured by FUJIFILM Dimatix Inc., and then sandwiched using the mold under a helium atmosphere. After exposure was performed from the quartz mold side using a high-pressure mercury lamp under a condition of 100 mJ/cm$^2$, the quartz mold was released to obtain a pattern.

The sample was introduced into the etching device (Centura-DPS manufactured by Applied Materials, Inc.), and etching (1) and etching (2) were continuously performed in this order under the following conditions. The obtained etching pattern was observed with a scanning electron microscope (SEM), and the number (defect density (DD), the unit was defects/cm$^2$) of defects was checked.

(Etching Conditions)

TABLE 1

|  | Etching (1) | Etching (2) |
|---|---|---|
| Source | 50 W | 50 W |
| Bias | 50 W | 50 W |
| Pressure | 10 mTorr | 10 mTorr |
| Substrate temperature | 40° C. | 40° C. |
| CHF$_3$ | — | 20 sccm |
| O$_2$ | 20 sccm | 20 sccm |
| Ar | — | 30 sccm |
| Etching time | 30 sec | 60 sec |

The results are shown below. A or B is preferable, and A is more preferable.

A: DD<1 defect/cm$^2$
B: 1 defect/cm$^2$≤DD<100 defects/cm$^2$
C: 100 defects/cm$^2$≤DD<1,000 defects/cm$^2$
D: DD≥1,000 defects/cm$^2$ <Evaluation of Temporal Stability>

10 g of the curable composition for imprinting was collected in a bloom-treated vial. Then, the vial was stored for 1 month in an environment of 50° C. and a relative humidity (RH) of 85%. Thereafter, the presence or absence of formation of a dark polymerization component (component polymerized in the vial) in the curable composition for imprinting was checked using gel permeation chromatography (GPC)-multi angle light scattering (MALS). Specifically, each sample was diluted to 10% by mass with tetrahydrofuran (THF) and filtered with a cellulose acetate-made filter having a pore diameter of 0.2 μm, and the resultant was used as a measurement sample for gel permeation chromatography (GPC). In a refractive index (RI) inspection, regarding the curable composition for imprinting before and after the lapse of time, the presence or absence of a new peak and an amount S of the dark polymerization component calculated from a peak surface area were measured by using light scattering. For the amount S of the dark polymerization component, a proportion of the peak surface area of the dark polymerization component to the total sum of all peak surface areas was calculated (unit is %).

A: S=0
B: 0<S≤0.001
C: 0.001<S≤0.01
D: S>0.01

<Evaluation of Mold Durability>

As the quartz mold, a quartz mold with a line/space having a line width of 20 nm and a depth of 55 nm was used. Coordinates of 500 places in the quartz mold where defects (mask defects) did not exist were grasped in advance using a mask defect review scanning electron microscope (SEM) device E5610 (manufactured by ADVANTEST CORPORATION).

A silicon wafer was spin-coated with the composition for forming an adhesive film shown in Example 6 of JP2014-024322A, and heated for 1 minute using a hot plate at 220° C. to form an adhesive film having a thickness of 5 nm. The curable composition for imprinting was applied onto the wafer on which the adhesive film was formed by the ink jet method using an ink jet printer DMP-2831 manufactured by FUJIFILM Dimatix Inc., and then sandwiched using the mold under a helium atmosphere. After exposure was performed from the quartz mold side using a high-pressure mercury lamp under a condition of 100 mJ/cm$^2$, the quartz mold was released to obtain a pattern.

This imprint process was repeated 100 times, then the quartz mold was recovered, and it was checked whether or not defects in the quartz mold were generated at the 500 places. A, B, or C is preferable, A or B is more preferable, and A is even more preferable.

A: The generation of defects in the quartz mold was not observed
B: The number of places where defects in the quartz mold were observed was less than 5
C: The number of places where defects in the quartz mold were observed was 5 or more and less than 25
D: The number of places where defects in the quartz mold were observed was 25 or more <Releasability>

As the quartz mold, a quartz mold with a line/space having a line width of 20 nm and a depth of 55 nm was used.

A silicon wafer was spin-coated with the composition for forming an adhesive film shown in Example 6 of JP2014-024322A, and heated for 1 minute using a hot plate at 220° C. to form an adhesive film having a thickness of 5 nm. The curable composition for imprinting was applied onto the wafer on which the adhesive film was formed by the ink jet method using an ink jet printer DMP-2831 manufactured by FUJIFILM Dimatix Inc., and then sandwiched using the mold under a helium atmosphere. After exposure was performed from the quartz mold side using a high-pressure mercury lamp under a condition of 100 mJ/cm$^2$, the quartz mold was released to obtain a pattern.

In the pattern formation, a force (releasing force F, unit: N) required for release in a case where the quartz mold was released was measured.

The releasing force was measured according to the method described in Comparative Examples described in paragraphs 0102 to 0107 of JP2011-206977A.

A: F≤15 N
B: 15 N<F≤18 N
C: 18 N<F≤20 N
D: F>20 N

Comparative Example 2

<Preparation of Curable Composition for Imprinting>

The following components were formulated in a PFA-made bottle, which had been subjected to an acid cleaning treatment, to prepare a curable composition for imprinting.

1,6-Hexanediol diacrylate 45 parts by mass
Benzyl acrylate 38 parts by mass
Isobornyl acrylate 10 parts by mass
LUCIRIN TPO (produced by BASF SE) 2 parts by mass
DAROCUR 1173 (produced by BASF SE) 2 parts by mass
Brij35 (produced by Kishida Chemical Co., Ltd.) 3 parts by mass In the same manner as in Comparative Example 1, the concentration of the particulate metal including a metal, the acid value, the amine value, the etching defects, the temporal stability, the mold durability, and the releasability were measured or evaluated.

Comparative Example 3

The following components were formulated in a PFA-made bottle, which had been subjected to an acid cleaning treatment, to prepare a curable composition for imprinting.
SILICONE ACRYLATE X-22-1602 (produced by Shin-Etsu Chemical Co., Ltd., Mw of 2,400) 96 parts by mass
IRGACURE 907 (produced by BASF SE) 3 parts by mass
SURFLON S-650 (produced by AGC SEIMI CHEMICAL CO., LTD.) 1 part by mass In the same manner as in Comparative Example 1, the concentration of the particulate metal including a metal, the acid value, the amine value, the etching defects, the temporal stability, the mold durability, and the releasability were measured or evaluated.

Comparative Example 4

300 g of an ion exchange resin (AMBERLYST (registered trademark), 15JS-HG·DRY, produced by ORGANO CORPORATION) was formulated with 1,000 g of the curable composition for imprinting prepared in Comparative Example 1, and the mixture was stirred for 6 hours. A supernatant liquid was collected in a PFA-made bottle, which had been subjected to an acid cleaning treatment, to obtain a curable composition for imprinting of Comparative Example 4.

In the same manner as in Comparative Example 1, the concentration of the particulate metal including a metal, the acid value, the amine value, the etching defects, the temporal stability, the mold durability, and the releasability were measured or evaluated.

Comparative Example 5

300 g of an ion exchange resin (AMBERLYST (registered trademark), MSPS2-1·DRY, produced by ORGANO CORPORATION) was formulated with 1,000 g of the curable composition for imprinting prepared in Comparative Example 1, and the mixture was stirred for 6 hours. Then, the same processes as in Comparative Example 4 were performed.

Comparative Example 6

300 g of an ion exchange resin (AMBERLYST (registered trademark), 15JS-HG·DRY, produced by ORGANO CORPORATION) was formulated with 1,000 g of the curable composition for imprinting prepared in Comparative Example 3, and the mixture was stirred for 6 hours. Then, the same processes as in Comparative Example 4 were performed.

Example 1

The curable composition for imprinting prepared in Comparative Example 4 was filtered with an ultra-high-molecular-weight polyethylene (UPE) filter having a pore diameter of 20 nm and then a polyamide filter having a pore diameter of 3 nm. A temperature at that time was 23° C. A filtration pressure was 0.1 MPa and a filtration rate was 0.09 L/min. After 500 mL of an initial flow passed through the filter was discarded, the resultant was collected in a PFA-made bottle, which had been subjected to an acid cleaning treatment, to obtain a curable composition for imprinting of Example 1.

In the same manner as in Comparative Example 1, the concentration of the particulate metal including a metal, the acid value, the amine value, the etching defects, the temporal stability, the mold durability, and the releasability were measured or evaluated.

Example 2

The curable composition for imprinting prepared in Comparative Example 5 was filtered with an ultra-high-molecular-weight polyethylene (UPE) filter having a pore diameter of 10 nm and then a polyamide filter having a pore diameter of 3 nm. A temperature at that time was 23° C. Moreover, the filtration was performed in a clean room satisfying Class 1000 (Class 6 in ISO 14644-1:2015) of Federal Specifications and Standards (Fed. Std. 209E) (hereinafter, this is true for filtration). A filtration pressure was 0.1 MPa and a filtration rate was 0.2 L/min. After 500 mL of an initial flow passed through the filter was discarded, the resultant was collected in a PFA-made bottle, which had been subjected to an acid cleaning treatment. Then, the same processes as in Example 1 were performed.

Example 3

Each of the following components was subjected to a metal removal treatment by distillation and acid cleaning as described below:

100 ppm by mass of a 4-hydroxy-2,2,6,6-tetramethylpiperidine N-oxyl free radical (4-HO-TEMPO, produced by FUJIFILM Wako Pure Chemical Corporation) was added to each of 1,6-hexanediol diacrylate, benzyl acrylate, and isobornyl acrylate, and each component was subjected to distillation under reduced pressure at 0.67 kPa. A distillation point was 90° C. to 150° C.

LUCIRIN TPO was dissolved in ethyl acetate and then mixed with 1 N hydrochloric acid in a ratio (mass ratio) of 1:1 in a separating funnel, and the mixture was sufficiently stirred. The mixture was left to stand until the mixture was separated into a water phase/an organic solvent phase, and the water phase was removed. The liquid separation purification operation was repeated three times, and then liquid separation purification was performed using ion exchange water to remove an acid component dissolved in the organic solvent. Thereafter, ethyl acetate was removed by distillation to obtain a desired compound.

100 ppm by mass of a 4-hydroxy-2,2-6,6-tetramethylpiperidine N-oxyl free radical (4-HO-TEMPO, produced by FUJIFILM Wako Pure Chemical Corporation) was added to DAROCUR 1173, and the resultant was subjected to distillation under reduced pressure at 0.67 kPa. A distillation point was 105° C.

Brij35 was dissolved in ethyl acetate and then mixed with 2 N hydrochloric acid in a ratio of 1:1 in a separating funnel, and the mixture was sufficiently stirred. The mixture was left to stand until the mixture was separated into a water phase/an organic solvent phase, and the water phase was removed. The liquid separation purification operation was repeated twice, and then liquid separation purification was performed using ion exchange water to remove an acid component dissolved in the organic solvent. Thereafter, ethyl acetate was removed by distillation to obtain a desired compound.

Subsequently, the respective components subjected to the metal removal treatment were formulated in the following ratio in a PFA-made bottle, which had been subjected to an acid cleaning treatment, to obtain a curable composition for imprinting.

1,6-Hexanediol diacrylate 45 parts by mass
    Benzyl acrylate 38 parts by mass
    Isobornyl acrylate 10 parts by mass
    LUCIRIN TPO 2 parts by mass
    DAROCUR 1173 2 parts by mass
    Brij35 3 parts by mass Regarding the obtained curable composition for imprinting, the concentration of the particulate metal including a metal, the acid value, the amine value, the etching defects, the temporal stability, the mold durability, and the releasability were measured or evaluated in the same manner as in Comparative Example 1.

Example 4

Each of the following components was subjected to a metal removal treatment by distillation and acid cleaning as described below.

1,3-Phenylene bis(methylene) diacrylate, neopentylglycol diacrylate, and lauryl acrylate were treated in the same manner as 1,6-hexanediol diacrylate described in Example 3.
    IRGACURE 819 was treated in the same manner as LUCIRIN TPO described in Example 3.
    Polypropylene glycol (Mw=700) was treated in the same manner as Brij35 described in Example 3.

Subsequently, the respective components subjected to the metal removal treatment were formulated in the following ratio in a PFA-made bottle, which had been subjected to an acid cleaning treatment, to obtain a curable composition for imprinting.

1,3-Phenylene bis(methylene) diacrylate 50 parts by mass
    Neopentylglycol diacrylate 30 parts by mass
    Lauryl acrylate 15 parts by mass
    IRGACURE 8192 parts by mass
    Polypropylene glycol (Mw=700) 3 parts by mass Regarding the obtained curable composition for imprinting, the concentration of the particulate metal including a metal, the acid value, the amine value, the etching defects, the temporal stability; the mold durability, and the releasability were measured or evaluated in the same manner as in Comparative Example 1.

Example 5

The curable composition for imprinting prepared in Example 4 was filtered with a UPE filter having a pore diameter of 10 nm and then a polyamide filter having a pore diameter of 3 nm. A temperature at that time was 23° C. A filtration pressure was 0.1 MPa and a filtration rate was 0.09 L/min. After 500 mL of an initial flow passed through the filter was discarded, the resultant was collected in a PFA-made bottle, which had been subjected to an acid cleaning treatment. Then, the same processes as in Example 1 were performed.

Example 6

The curable composition for imprinting prepared in Example 3 was filtered with a UPE filter having a pore diameter of 10 nm and then a polyamide filter having a pore diameter of 5 nm. A temperature at that time was 23° C. A filtration pressure was 0.1 MPa and a filtration rate was 0.09 L/min. After 500 mL of an initial flow passed through the filter was discarded, the resultant was collected in a PFA-made bottle, which had been subjected to an acid cleaning treatment. Then, the same processes as in Example 1 were performed.

Example 7

The curable composition for imprinting prepared in Example 4 was filtered with a UPE filter having a pore diameter of 10 nm and then a UPE filter having a pore diameter of 5 nm and having a hydroxyl group derived from hydroxymethyl acrylamide as the neutral group produced with reference to the description in paragraphs 0058 and 0059 of JP2017-536232A. A temperature at that time was 23° C. A filtration pressure was 0.1 MPa and a filtration rate was 0.09 L/min. After 500 mL of an initial flow passed through the filter was discarded, the resultant was collected in a PFA-made bottle, which had been subjected to an acid cleaning treatment. Then, the same processes as in Example 1 were performed.

Example 8

The curable composition for imprinting prepared in Example 4 was filtered with a UPE filter having a pore diameter of 10 nm and then a UPE filter having a pore diameter of 3 nm and having a hydroxyl group derived from hydroxymethyl acrylamide as the neutral group produced with reference to the description in paragraphs 0058 and 0059 of JP2017-536232A. A temperature at that time was 23° C. A filtration pressure was 0.1 MPa and a filtration rate was 0.09 L/min. After 500 mL of an initial flow passed through the filter was discarded, the resultant was collected in a PFA-made bottle, which had been subjected to an acid cleaning treatment. Then, the same processes as in Example 1 were performed.

Comparative Example 7

The curable composition for imprinting prepared in Example 8 was filtered with a UPE filter having a pore diameter of 10 nm and then a UPE filter having a pore diameter of 3 nm and having a hydroxyl group derived from hydroxymethyl acrylamide as the neutral group produced with reference to the description in paragraphs 0058 and 0059 of JP2017-536232A. A temperature at that time was 23° C. A filtration pressure was 0.1 MPa and a filtration rate was 0.09 L/min. After 500 mL of an initial flow passed through the filter was discarded, the resultant was collected in a PFA-made bottle, which had been subjected to an acid cleaning treatment. Regarding the treatments after the UPE filter having a pore diameter of 10 nm, the same treatments were performed three more times, and then the substance collected in the PFA-made bottle, which had been subjected to an acid cleaning treatment, was used as Comparative Example 7. Then, the same processes as in Example 1 were performed.

Example 9

The curable composition for imprinting prepared in Example 4 was filtered with a polyamide filter having a pore diameter of 3 nm. A temperature at that time was 23° C. A filtration pressure was 0.1 MPa and a filtration rate was 0.09 L/min. After 500 mL of an initial flow passed through the filter was discarded, the resultant was collected in a PFA-made bottle, which had been subjected to an acid cleaning treatment. Then, the same processes as in Example 1 were performed.

The results of Comparative Examples and Examples are shown below.

TABLE 2

|  |  | Comparative Example 1 | Comparative Example 2 | Comparative Example 3 | Comparative Example 4 | Comparative Example 5 | Comparative Example 6 |
|---|---|---|---|---|---|---|---|
| Concentration of metal (unit is ppb) | Fe | 14.512 | 33.799 | 22.340 | 14.211 | 13.101 | 18.456 |
|  | Cu | 11.121 | 11.354 | 8.093 | 8.611 | 8.962 | 6.011 |
|  | Ti | 6.314 | 15.311 | 10.466 | 5.123 | 5.921 | 9.313 |
|  | Pb | 3.121 | 6.095 | 1.841 | 2.543 | 2.911 | 1.611 |
|  | Zn | 6.311 | 33.034 | 11.451 | 5.011 | 1.000 | 8.511 |
|  | Na | 23.098 | 121.000 | 46.968 | 8.881 | 9.921 | 9.911 |
|  | K | 13.120 | 28.460 | 18.014 | 4.006 | 6.578 | 5.013 |
|  | Ca | 7.164 | 44.145 | 11.000 | 2.320 | 3.112 | 2.111 |
|  | Mg | 5.314 | 23.400 | 8.431 | 0.800 | 0.835 | 4.161 |
|  | Mn | 3.468 | 9.145 | 3.462 | 2.013 | 0.521 | 2.111 |
|  | Li | 0.921 | 1.110 | 0.100 | 0.100 | 0.100 | 0.080 |
|  | Cr | 1.000 | 2.098 | 1.130 | 0.801 | 0.840 | 0.811 |
|  | Ni | 0.112 | 0.100 | 0.200 | 0.010 | 0.010 | 0.113 |
|  | Sn | 0.120 | 0.120 | 0.201 | 0.010 | 0.010 | 0.091 |
|  | As | 0.001 | 0.001 | 0.001 | 0.001 | 0.001 | 0.001 |
|  | Au | 0.003 | 0.010 | 0.005 | 0.001 | 0.001 | 0.001 |
|  | Ag | 0.010 | 0.030 | 0.010 | 0.001 | 0.001 | 0.001 |
|  | Cd | 0.001 | 0.001 | 0.001 | 0.001 | 0.001 | 0.001 |
|  | Co | 0.210 | 0.200 | 0.300 | 0.001 | 0.001 | 0.001 |
|  | Al | 5.487 | 29.145 | 11.355 | 3.311 | 1.167 | 8.111 |
|  | V | 0.001 | 0.001 | 0.001 | 0.001 | 0.001 | 0.001 |
|  | W | 0.001 | 0.001 | 0.001 | 0.001 | 0.001 | 0.001 |
| Concentration of specific particle (ppb by mass) |  | 35.068 | 66.559 | 42.740 | 30.488 | 30.895 | 35.391 |
| Concentration of all measured particles (ppb by mass) |  | 101.411 | 358.560 | 155.371 | 57.758 | 54.996 | 76.422 |
| Acid value (mmol/g) |  | 0.151 | 0.713 | 0.111 | 0.101 | 1.15 | 0.099 |
| Amine value (mmol/g) |  | 0.511 | 0.233 | 0.333 | 1.51 | 0.211 | 1.31 |
| Evaluation of etching resistance |  | D | D | D | C | C | C |
| Evaluation of temporal stability |  | D | D | D | C | C | C |
| Mold durability |  | C | D | D | C | C | C |
| Evaluation of releasability |  | B | B | B | D | D | D |

TABLE 3

|  |  | Example 1 | Example 2 | Example 3 | Example 4 | Example 5 | Example 6 | Example 7 | Example 8 | Comparative Example 7 | Example 9 |
|---|---|---|---|---|---|---|---|---|---|---|---|
| Concentration of metal (unit is ppb) | Fe | 10.110 | 9.011 | 4.211 | 3.110 | 1.911 | 6.211 | 0.605 | 0.099 | 0.051 | 1.810 |
|  | Cu | 6.111 | 6.131 | 3.211 | 1.511 | 0.933 | 2.901 | 0.281 | 0.078 | 0.030 | 0.951 |
|  | Ti | 5.131 | 3.300 | 1.811 | 1.111 | 0.851 | 2.110 | 0.081 | 0.026 | 0.011 | 0.811 |
|  | Pb | 1.621 | 2.111 | 0.901 | 0.201 | 0.021 | 0.500 | 0.009 | 0.005 | 0.004 | 0.040 |
|  | Zn | 4.110 | 0.801 | 4.121 | 0.910 | 0.690 | 2.098 | 0.201 | 0.098 | 0.051 | 0.699 |
|  | Na | 5.612 | 6.691 | 10.811 | 3.112 | 1.120 | 9.311 | 0.711 | 0.098 | 0.020 | 0.991 |
|  | K | 4.101 | 0.050 | 5.210 | 0.031 | 0.020 | 4.911 | 0.008 | 0.002 | 0.001 | 0.020 |
|  | Ca | 1.110 | 2.111 | 4.819 | 1.101 | 0.509 | 6.891 | 0.101 | 0.051 | 0.021 | 0.501 |
|  | Mg | 0.600 | 0.050 | 2.111 | 0.055 | 0.040 | 2.871 | 0.008 | 0.006 | 0.006 | 0.100 |
|  | Mn | 0.010 | 0.010 | 0.501 | 0.891 | 0.031 | 2.112 | 0.011 | 0.008 | 0.005 | 0.029 |
|  | Li | 0.001 | 0.010 | 0.001 | 0.001 | 0.001 | 0.010 | 0.001 | 0.001 | 0.001 | 0.001 |
|  | Cr | 0.211 | 0.010 | 0.511 | 0.001 | 0.001 | 0.300 | 0.001 | 0.001 | 0.001 | 0.001 |
|  | Ni | 0.010 | 0.001 | 0.001 | 0.001 | 0.001 | 0.010 | 0.001 | 0.001 | 0.001 | 0.001 |
|  | Sn | 0.001 | 0.001 | 0.001 | 0.001 | 0.001 | 0.010 | 0.001 | 0.001 | 0.001 | 0.001 |
|  | As | 0.001 | 0.001 | 0.001 | 0.001 | 0.001 | 0.001 | 0.001 | 0.001 | 0.001 | 0.001 |
|  | Au | 0.001 | 0.001 | 0.001 | 0.001 | 0.001 | 0.001 | 0.001 | 0.001 | 0.001 | 0.001 |
|  | Ag | 0.001 | 0.001 | 0.001 | 0.001 | 0.001 | 0.001 | 0.001 | 0.001 | 0.001 | 0.001 |
|  | Cd | 0.001 | 0.001 | 0.001 | 0.001 | 0.001 | 0.001 | 0.001 | 0.001 | 0.001 | 0.001 |
|  | Co | 0.001 | 0.001 | 0.001 | 0.001 | 0.001 | 0.001 | 0.001 | 0.001 | 0.001 | 0.001 |
|  | Al | 1.911 | 0.711 | 1.113 | 1.311 | 0.609 | 3.101 | 0.101 | 0.071 | 0.021 | 0.633 |
|  | V | 0.001 | 0.001 | 0.001 | 0.001 | 0.001 | 0.001 | 0.001 | 0.001 | 0.001 | 0.001 |
|  | W | 0.001 | 0.001 | 0.001 | 0.001 | 0.001 | 0.001 | 0.001 | 0.001 | 0.001 | 0.001 |
| Concentration of specific particle (ppb by mass) |  | 22.973 | 20.553 | 10.134 | 5.933 | 3.716 | 11.722 | 0.976 | 0.208 | 0.096 | 3.612 |
| Concentration of all measured particles (ppb by mass) |  | 40.657 | 31.006 | 39.341 | 13.355 | 6.746 | 43.354 | 2.128 | 0.553 | 0.232 | 6.596 |

TABLE 3-continued

|  | Example 1 | Example 2 | Example 3 | Example 4 | Example 5 | Example 6 | Example 7 | Example 8 | Comparative Example 7 | Example 9 |
|---|---|---|---|---|---|---|---|---|---|---|
| Acid value (mmol/g) | 0.099 | 1.09 | 0.022 | 0.008 | 0.008 | 0.055 | 0.006 | 0.006 | 0.006 | 0.008 |
| Amine value (mmol/g) | 1.21 | 0.201 | 0.01 | 0.012 | 0.009 | 0.101 | 0.006 | 0.006 | 0.006 | 0.009 |
| Evaluation of etching resistance | B | B | B | A | A | B | A | A | A | A |
| Evaluation of temporal stability | B | B | B | B | A | B | A | A | A | A |
| Mold durability | B | B | B | B | B | C | A | A | D | B |
| Evaluation of releasability | C | C | A | A | A | A | A | A | A | A |

As is clear from the tables, the composition according to the embodiment of the present invention had excellent mold durability. Moreover, the etching resistance and the temporal stability were also excellent. Furthermore, by reducing the concentration of the specific particulate metal, the result in which the releasability was also excellent was obtained.

Meanwhile, in a case where the concentration of the specific particulate metal was high, at least one of the mold durability or the etching resistance was degraded. Moreover, the temporal stability was also degraded. In particular, in a case where only the ion exchange resin is used (Comparative Examples 4 to 6), the result in which the releasability was degraded compared to Comparative Examples 1 to 3 in which no treatment was performed was obtained.

What is claimed is:

1. A curable composition for imprinting comprising:
    a polymerizable compound having a polymerizable group with a (meth)acryloyl group;
    a photopolymerization initiator which is selected from the group consisting of an acetophenone-based compound, an acylphosphine oxide-based compound, an oxime ester-based compound and an oxime compound having a fluorine atom; and
    a particulate metal which has a particle diameter of 1 nm or larger, as measured by a single particle ICP-MASS method, and includes at least one kind of iron, copper, titanium, or lead,
    wherein a content of the particulate metal is 100 ppt by mass to 30 ppb by mass with respect to a solid content of the composition;
    an amine value of the curable composition is 0.001 mmol/g or more and 1 mmol/g or less; and
    an acid value of the curable composition is 0.001 mmol/g or more and 1 mmol/g or less.

2. The curable composition for imprinting according to claim 1, further comprising a particulate metal which is other than the aforementioned particulate metal, has a particle diameter of 1 nm or larger, as measured by the single particle ICP-MASS method, and contains at least one kind of sodium, potassium, calcium, magnesium, manganese, aluminum, lithium, chromium, nickel, tin, zinc, arsenic, silver, gold, cadmium, cobalt, vanadium, or tungsten,
    wherein a total amount of the particulate metal which has a particle diameter of 1 nm or larger, as measured by the single particle ICP-MASS method, and contains at least one kind of iron, copper, titanium, or lead and the particulate metal which is other than the aforementioned particulate metal, has a particle diameter of 1 nm or larger, as measured by the single particle ICP-MASS method, and contains at least one kind of sodium, potassium, calcium, magnesium, manganese, aluminum, lithium, chromium, nickel, tin, zinc, arsenic, silver, gold, cadmium, cobalt, vanadium, or tungsten is 250 ppt by mass to 40 ppb by mass with respect to the solid content of the composition.

3. The curable composition for imprinting according to claim 1,
    wherein a solvent is not substantially contained.

4. The curable composition for imprinting according to claim 1,
    wherein a polymer having a weight-average molecular weight of 2,000 or greater is not substantially contained.

5. The curable composition for imprinting according to claim 1,
    wherein a silicon atom is not substantially contained.

6. The curable composition for imprinting according to claim 5, further comprising a release agent.

7. The curable composition for imprinting according to claim 1,
    wherein a content of the polymerizable compound in the composition is 80% by mass or greater.

8. A method for producing the curable composition for imprinting according to claim 1, comprising using raw materials subjected to at least one of a distillation treatment or an acid cleaning treatment.

9. The method for producing the curable composition for imprinting according to claim 8, further comprising mixing the raw materials of the composition and then subjecting the mixture to a filtration treatment with a filter containing polyamide.

10. A cured product formed of the curable composition for imprinting according to claim 1.

11. A pattern producing method comprising applying the curable composition for imprinting according to claim 1 onto a substrate or a mold and irradiating the curable composition for imprinting with light in a state of being sandwiched between the mold and the substrate.

12. The pattern producing method according to claim 11,
    wherein a pattern has at least one shape of a line having a line width of 100 nm or less or a hole having a hole diameter of 100 nm or less.

13. A method for manufacturing a semiconductor element, comprising the pattern producing method according to claim 11.

14. The method for manufacturing a semiconductor element, comprising performing etching using a pattern obtained by the pattern producing method according to claim 11 as a mask.

* * * * *